(12) United States Patent
Morrison

(10) Patent No.: US 11,251,584 B2
(45) Date of Patent: *Feb. 15, 2022

(54) TUNABLE LASER

(71) Applicant: Freedom Photonics LLC, Goleta, CA (US)

(72) Inventor: Gordon Barbour Morrison, Summerland, CA (US)

(73) Assignee: Freedom Photonics LLC, Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/431,285

(22) Filed: Jun. 4, 2019

(65) Prior Publication Data

US 2019/0386463 A1    Dec. 19, 2019

Related U.S. Application Data

(63) Continuation of application No. 15/938,842, filed on Mar. 28, 2018, now Pat. No. 10,320,152.

(Continued)

(51) Int. Cl.
*H01S 5/125* (2006.01)
*H01S 5/06* (2006.01)
(Continued)

(52) U.S. Cl.
CPC ............ *H01S 5/125* (2013.01); *H01S 5/0071* (2013.01); *H01S 5/0614* (2013.01); *H01S 5/06255* (2013.01); *H01S 5/06256* (2013.01); *H01S 5/1234* (2013.01); *H01S 5/2228* (2013.01); *H01S 5/34* (2013.01); *H01S 5/04254* (2019.08); *H01S 5/1209* (2013.01)

(58) Field of Classification Search
CPC ..... H01S 5/1234; H01S 5/0614; H01S 5/2228
See application file for complete search history.

(56) References Cited

U.S. PATENT DOCUMENTS 3,752,992 A    8/1973    Fluhr et al.
3,939,341 A    2/1976    Graves et al.
(Continued)

FOREIGN PATENT DOCUMENTS

EP    1087478    3/2001
JP    H0391278    4/1991
(Continued)

OTHER PUBLICATIONS

Hofstetter, D.et al., "Single-growth-step GaAslAlGaAs distributed Bragg reflector lasers with holographically-defined recessed gratings", Electronics Letters Oct. 27, 1994 vol. 30(22): 1858-1859.

(Continued)

*Primary Examiner* — Tuan N Nguyen
(74) *Attorney, Agent, or Firm* — Knobbe Martens Olson & Bear, LLP

(57) ABSTRACT

A tunable wavelength laser comprising a laser cavity formed by a broadband mirror and a comb mirror. The laser cavity comprising a gain region. The laser cavity is configured such that a non-integer number of cavity modes of the laser cavity are between two consecutive reflection peaks of the comb mirror.

16 Claims, 9 Drawing Sheets
(9 of 9 Drawing Sheet(s) Filed in Color)

Related U.S. Application Data

(60) Provisional application No. 62/477,908, filed on Mar. 28, 2017, provisional application No. 62/489,922, filed on Apr. 25, 2017, provisional application No. 62/596,655, filed on Dec. 8, 2017.

(51) Int. Cl.
| | |
|---|---|
| *H01S 5/0625* | (2006.01) |
| *H01S 5/12* | (2006.01) |
| *H01S 5/042* | (2006.01) |
| *H01S 5/22* | (2006.01) |
| *H01S 5/00* | (2006.01) |
| *H01S 5/34* | (2006.01) |

(56) References Cited

U.S. PATENT DOCUMENTS

| | | | |
|---|---|---|---|
| 3,970,838 | A | 7/1976 | Goodwin et al. |
| 3,984,835 | A | 10/1976 | Kaplan et al. |
| 4,063,084 | A | 12/1977 | Goodwin et al. |
| 4,168,397 | A | 9/1979 | Bradley |
| 4,596,052 | A | 6/1986 | Wright et al. |
| 4,608,697 | A | 8/1986 | Coldren |
| 4,622,672 | A | 11/1986 | Coldren et al. |
| 4,719,636 | A | 1/1988 | Yamaguchi |
| 4,870,654 | A | 9/1989 | Cantoni et al. |
| 4,893,352 | A | 1/1990 | Welford |
| 4,896,325 | A * | 1/1990 | Coldren .......... H01S 5/06256 372/102 |
| 4,903,341 | A | 2/1990 | Rice |
| 4,903,342 | A | 2/1990 | Yamazaki |
| 4,904,963 | A | 2/1990 | Heidel |
| 5,003,625 | A | 3/1991 | Khoe |
| 5,007,106 | A | 4/1991 | Kahn et al. |
| 5,008,957 | A | 4/1991 | Kiyono |
| 5,034,603 | A | 7/1991 | Wilson |
| 5,088,105 | A | 2/1992 | Scrifres et al. |
| 5,091,916 | A | 2/1992 | Cirnini, Jr. et al. |
| 5,101,450 | A | 3/1992 | Olshansky |
| 5,126,557 | A | 6/1992 | Khoe et al. |
| 5,170,274 | A | 12/1992 | Kuwata et al. |
| 5,181,136 | A | 1/1993 | Kavehrad et al. |
| 5,222,103 | A | 6/1993 | Gross |
| 5,237,292 | A | 8/1993 | Chethik |
| 5,319,667 | A | 6/1994 | Dutting et al. |
| 5,323,258 | A | 6/1994 | Tsushima et al. |
| 5,325,392 | A | 6/1994 | Tohmori et al. |
| 5,347,608 | A | 9/1994 | Nakamura et al. |
| 5,351,317 | A | 9/1994 | Weber |
| 5,359,449 | A | 10/1994 | Nishimoto et al. |
| 5,398,256 | A | 3/1995 | Hohimer et al. |
| 5,412,226 | A | 5/1995 | Rejman-Greene et al. |
| 5,424,863 | A | 6/1995 | Gertel |
| 5,452,118 | A | 9/1995 | Maruska |
| 5,654,818 | A | 8/1997 | Yao |
| 5,915,051 | A | 6/1999 | Damask et al. |
| 6,020,963 | A | 2/2000 | DiMarzio |
| 6,078,412 | A | 6/2000 | Fuse et al. |
| 6,205,159 | B1 | 3/2001 | Sesko et al. |
| 6,271,950 | B1 | 8/2001 | Hansen et al. |
| 6,407,843 | B1 | 6/2002 | Rowan et al. |
| 6,407,845 | B2 | 6/2002 | Nakamoto |
| 6,421,155 | B1 | 7/2002 | Yano |
| 6,459,521 | B1 | 10/2002 | Bakker et al. |
| 6,556,327 | B1 | 4/2003 | Ohya |
| 6,584,136 | B2 | 6/2003 | Ju et al. |
| 6,646,747 | B2 | 11/2003 | Deliwala |
| 6,661,975 | B1 | 12/2003 | Hall et al. |
| 6,704,375 | B1 | 3/2004 | Serbe |
| 6,757,499 | B1 | 6/2004 | Aoki |
| 6,781,741 | B2 | 8/2004 | Uesaka |
| 6,782,205 | B2 | 8/2004 | Trisnadi |
| 6,807,321 | B2 | 10/2004 | Madsen |
| 6,978,056 | B2 | 12/2005 | Tavlykaev |
| 7,023,601 | B2 | 4/2006 | McGhan et al. |
| 7,027,476 | B2 | 4/2006 | Taghavi-Larigani et al. |
| 7,035,486 | B2 | 4/2006 | Griffin et al. |
| 7,078,981 | B2 | 7/2006 | Farag |
| 7,103,239 | B2 | 9/2006 | Kish |
| 7,116,460 | B2 | 10/2006 | Griffin |
| 7,120,364 | B2 | 10/2006 | Kovar |
| 7,130,325 | B2 | 10/2006 | Oh et al. |
| 7,200,296 | B2 | 4/2007 | Kish |
| 7,209,664 | B1 | 4/2007 | McNicol et al. |
| 7,212,326 | B2 | 5/2007 | Wooten et al. |
| 7,245,788 | B2 | 7/2007 | Fujita et al. |
| 7,272,271 | B2 | 9/2007 | Kaplan et al. |
| 7,327,022 | B2 | 2/2008 | Claydon |
| 7,366,362 | B2 | 4/2008 | Tanimura |
| 7,457,496 | B2 | 11/2008 | Joyner |
| 7,460,793 | B2 | 12/2008 | Taylor |
| 7,466,882 | B2 | 12/2008 | Kish |
| 7,633,988 | B2 | 12/2009 | Fish |
| 7,751,658 | B2 | 7/2010 | Welch |
| 7,885,492 | B2 | 2/2011 | Welch |
| 8,401,399 | B2 | 3/2013 | Barton et al. |
| 8,401,405 | B2 | 3/2013 | Barton et al. |
| 8,712,256 | B2 | 4/2014 | Barton et al. |
| 8,718,486 | B2 | 5/2014 | Barton et al. |
| 9,246,596 | B2 | 1/2016 | Barton et al. |
| 9,270,380 | B2 | 2/2016 | Barton et al. |
| 9,344,196 | B1 | 5/2016 | Mashanovitch et al. |
| 9,887,780 | B2 | 2/2018 | Barton et al. |
| 9,941,971 | B1 | 4/2018 | Mashanovitch et al. |
| 10,320,152 | B2 | 6/2019 | Morrison |
| 10,355,451 | B2 | 7/2019 | Morrison et al. |
| 2002/0085609 | A1 | 7/2002 | Ksendzov et al. |
| 2002/0105991 | A1 | 8/2002 | Coidren et al. |
| 2002/0186727 | A1 | 12/2002 | Aoki |
| 2003/0026302 | A1 | 2/2003 | Anthon et al. |
| 2003/0099425 | A1 | 5/2003 | Grubb et al. |
| 2003/0161370 | A1* | 8/2003 | Buimovich ......... H01S 5/06255 372/50.1 |
| 2004/0076199 | A1* | 4/2004 | Wipiejewski ......... H01S 5/0265 372/26 |
| 2004/0105476 | A1* | 6/2004 | Wasserbauer ........... H01S 5/141 372/50.22 |
| 2004/0179569 | A1* | 9/2004 | Sato ..................... H01S 5/4068 372/50.11 |
| 2004/0207896 | A1 | 10/2004 | Aoki et al. |
| 2005/0025419 | A1 | 2/2005 | Fish et al. |
| 2005/0111852 | A1 | 5/2005 | Mahgerefteh |
| 2005/0123017 | A1 | 6/2005 | Huang et al. |
| 2005/0135733 | A1 | 6/2005 | Reid |
| 2005/0163186 | A1 | 7/2005 | Petersen |
| 2005/0213618 | A1 | 9/2005 | Sochava et al. |
| 2005/0230695 | A1 | 10/2005 | Takayama |
| 2005/0265647 | A1 | 12/2005 | Vakhshoori et al. |
| 2006/0013273 | A1* | 1/2006 | Menon ................ H01S 5/06256 372/32 |
| 2006/0093012 | A1 | 5/2006 | Singh et al. |
| 2006/0187995 | A1 | 8/2006 | Peters et al. |
| 2006/0193362 | A1 | 8/2006 | Kopf et al. |
| 2006/0251139 | A1* | 11/2006 | He .......................... H01S 5/10 372/66 |
| 2007/0122161 | A1 | 5/2007 | Charlet et al. |
| 2007/0230617 | A1 | 5/2007 | Tao et al. |
| 2007/0133918 | A1 | 6/2007 | Cho et al. |
| 2007/0177882 | A1 | 8/2007 | Akiyama |
| 2008/0056727 | A1 | 3/2008 | Nishihara et al. |
| 2008/0080872 | A1 | 4/2008 | Tanaka et al. |
| 2009/0245795 | A1 | 10/2009 | Joyner |
| 2009/0245796 | A1 | 10/2009 | Little |
| 2009/0279576 | A1 | 11/2009 | Joyner et al. |
| 2010/0091293 | A1 | 4/2010 | Shani |
| 2010/0202734 | A1 | 8/2010 | DeCorby |
| 2010/0303469 | A1 | 12/2010 | Barton |
| 2010/0303476 | A1 | 12/2010 | Barton et al. |
| 2011/0103735 | A1 | 5/2011 | Oikawa et al. |
| 2011/0157670 | A1 | 6/2011 | Koch |
| 2011/0217002 | A1 | 9/2011 | Mekis |
| 2011/0243175 | A1 | 10/2011 | Evans et al. |
| 2011/0267676 | A1 | 11/2011 | Dallesasse et al. |

(56) References Cited

U.S. PATENT DOCUMENTS

| | | |
|---|---|---|
| 2012/0106984 A1 | 5/2012 | Jones et al. |
| 2012/0205524 A1 | 8/2012 | Mack et al. |
| 2012/0314277 A1 | 12/2012 | Matsuda |
| 2013/0016744 A1 | 1/2013 | Li et al. |
| 2013/0148982 A1 | 6/2013 | Barton |
| 2014/0057413 A1 | 2/2014 | Yang |
| 2014/0064659 A1 | 3/2014 | Doerr et al. |
| 2014/0079082 A1 | 3/2014 | Feng et al. |
| 2014/0254978 A1 | 9/2014 | Koch et al. |
| 2014/0348516 A1 | 11/2014 | Barton et al. |
| 2014/0356001 A1 | 12/2014 | Barton et al. |
| 2014/0360013 A1 | 12/2014 | Chen |
| 2014/0363127 A1 | 12/2014 | Baets et al. |
| 2015/0098677 A1 | 4/2015 | Thacker et al. |
| 2015/0270684 A1 | 9/2015 | Suzuki et al. |
| 2015/0333475 A1 | 11/2015 | Blumenthal |
| 2016/0344480 A1 | 11/2016 | Barton et al. |
| 2018/0287343 A1 | 10/2018 | Morrison et al. |
| 2019/0386463 A1 | 12/2019 | Morrison |
| 2020/0183195 A1 | 6/2020 | Morrison |

FOREIGN PATENT DOCUMENTS

| | | |
|---|---|---|
| JP | H0645693 | 2/1994 |
| JP | 2003-043430 | 2/2003 |
| JP | 2003-177365 | 6/2003 |
| JP | 2005-077987 | 3/2005 |
| JP | 2010-539818 | 12/2010 |
| JP | 2011-253930 | 12/2011 |
| JP | 2012-98744 | 5/2012 |
| JP | 2012-156335 | 8/2012 |
| JP | 2012-156336 | 8/2012 |
| KR | 10-2004-0081838 | 9/2004 |
| KR | 10-2014-0077533 | 6/2014 |
| WO | WO 95/22070 | 8/1995 |
| WO | WO 03/079508 | 9/2003 |
| WO | WO 2007/107187 | 9/2007 |
| WO | WO 2008/036313 | 3/2008 |
| WO | WO 2009/036390 | 3/2009 |
| WO | WO 2011/060325 | 5/2011 |
| WO | WO 2012/019290 | 2/2012 |
| WO | WO 2015/064225 | 5/2015 |

OTHER PUBLICATIONS

Kazuhiro Komori, et. al., "Single-Mode Properties of Distributed-Reflector Lasers", IEEE Journal of Quantum Electronics, vol. 25, No. 6, Jun. 1989, pp. 1235-1244.

Arimoto, H. et al., "Wavelength-Tunable Short-Cavity DBR Laser Array With Active Distributed Bragg Reflector", Journal of Lightwave Technology, vol. 24(11):4436-4371, Nov. 2006.

Jayaraman V. et al., "Theory, Design and Performance of Extended Tuning Range Semiconductor Laser with Sampled Grating", J. of Quantum Electronics, 29, pp. 1824-1834, 1993.

Wesstrom, J.O, et al, "Design of a Widely Tunable Modulated Grating Y-branch Laser using the Additive Vernier Effect for Improved Super-mode Selection," Semiconductor Laser Conference, 2002, pp. 99-100.

Griffin, R.A, et al. "Integrated Devices for Advanced Modulation Formats," 2004 IEEE/LEOS Workshop on Advanced Modulation Formats, pp. 39-40, Jul. 1-2, 2004.

Kato, M. et al., "Transmitter PIC for 10-Channel x 40Gb/s per Channel Polarization—Multiplexed RZ-DQPSK Modulation," in Optical Fiber Communication Conference, OSA Technical Digest (CD) (Optical Society of America, 2009), paper OThN2, March, 2009.

Seimetz M. "Performance of Coherent Optical Square-16-QAM-Systems based on IQ-Transmitters and Homodyne Receivers with Digital Phase Estimation," in Optical Fiber Communication Conference and Exposition and The National Fiber Optic Engineers Conference, Technical Digest (CD) (Optical Society of America, 2006), paper NWA4, Mar. 2006.

Seimetz M. "Multi-Format Transmitters for Coherent Optical M-PSK and M-QAM Transmission," Transparent Optical Networks, 2005, Proceedings of 2005 7th International Conference, vol. 2, pp. 225-229, Jul. 2005.

Doerr, C.R., et al., "Monolithic InP 16-QAM Modulator," in Optical Fiber Communication Conference and Exposition and The National Fiber Optic Engineers Conference. OSA Technical Digest (CD) (Optical Society of America. 2008 ), paper PDP20, Feb. 2008.

Doerr, C.R., et al., "Compact High-Speed InP DQPSK Modulator," IEEE, Photonics Technology Letters, vol. 19, No. 15, pp. 1184-1186, Aug. 2007.

Shin, M. et al., "A novel BPSK Method using Multiple Quantum Well Electro-Absorption Modulator Integrated with MMI couplers," International Topical Meeting on Microwave photonics, MWP'99 Digest, pp. 149-152, Nov. 1999.

Griffin, R.A, et al., "Optical Differential Quadrature Phase-Shift Key (oDQPSK) for High Capacity Optical Transmission, " in Optical Fiber Communications Conference, vol. 70 of OSA Trends in Optics and Photonics (Optical Society of America, 2002), paper WX6, Mar. 2002.

Di, L. et al., "Single-Facet Folded-Cavity Diode Laser With Ultrasmall Bend Radius High-Index-Contrast Oxidized AlGaAs Ridge Waveguide," IEEE Photonics Technology Letters, vol. 19, No. 8, pp. 598-600, Apr. 2007.

Wang, S. et al., "Analysis of ring distributed feedback lasers," Journal of Applied Physics, vol. 45, No. 9, pp. 3978-3980,Sep. 1974.

Corzine, S. et al., "1O-Channel x 40Gb/s per channel DQPSK Monolithically Integrated InP-based Transmitter PIC," in National Fiber Optic Engineers Conference, OSA Technical Digest (CD) (Optical Society of America, 2008), paper PDP18, Feb. 2008.

Cho, P., et al., "Coherent Homodyne Detection ofBPSK Signals Using Time-Gated Amplification and LiNb03 Optical 90° Hybrid," IEEE Photonics Technology Letter, vol. 16, No. 7, pp. 1727-1729, Jul. 2004.

Cho, P., et al., "Investigation of2-b/slHz 40 GB/s DWDM Transmission Over 4x100 km SMF-28 Fiber Using RZ-DQPSK and Polarization Multiplexing," IEEE Photonics Technology Letter, vol. 16, No. 2, pp. 656-658, Feb. 2004.

Cho, P., et al., "Transmission of 25-GB/s RZ-DQPSK Signals with 25-GHz Channel Spacing Over 1000 km of SMF-28 Fiber," IEEE Photonics Technology Letter, vol. 15, No. 3, pp. 473-475, Mar. 2003.

Zhu, B., et al., "High Spectral Density Long-Haul40-GB/s Transmission Using CSRZ-DPSK Format," Journal of Lightwave Technology, vol. 22, No. 1, pp. 208-214, Jan. 2004.

Griffin, R.A., et al., "Integrated DQPSK Transmitter for Dispersion-Tolerant and Dispersion-Managed DWDM Transmission," in Optical Fiber Communications of Conference, (Optical Society of America, 2003), paper FP6, Mar. 2003.

Cobb, K.W. et al., "Reduction of optical phase noise in semiconductor lasers," Electronics Letters, vol. 18, Issue 8, pp. 336-337, Apr. 15, 1982.

Glance, B., "Performance of AFC for phase noise reduction of optical sources," Electronics Letters, vol. 21, Issue 21, pp. 994-996, Oct. 10, 1985.

Kikuchi, K. et al., "Design theory of electrically frequency-controlled narrow-linewidth semiconductor lasers for coherent optical communication systems," Journal of Lightwave Technology, vol. 5, Issue 9, pp. 1273-1276, Sep. 1987.

Langley et al., "Packaged semiconductor laser optical phase-locked loop (OPLL) for photonic generation, processing and transmission of microwave signals," IEEE Transactions on Microwave Theory and Techniques, Vo. 47, pp. 1257-1264, Jul. 1999.

Camatel, S. et al., "Optical phase-locked loop for coherent detection optical receiver," Electronics Letters, vol. 40, No. 6, pp. 384-38518 Mar. 2004.

Ferrero, V. et al., "A novel optical phase locked loop architecture based on sub-carrier modulation", in Optical Fiber Communication Conference, Technical Digest (CD) (Optical Society of America, 2004), paper FN6, Feb. 2004.

Tsukamoto, S. et al., "Coherent demodulation of optical multilevel phase-shift-keying signals using homodyne detection and digital

(56) References Cited

OTHER PUBLICATIONS signal processing", IEEE Photonics Technology Letters, vol. 18, No. 10, pp. 1131-1133, May 2006.
Noe, R. "Phase noise-tolerant synchronous QPSK1BPSK baseband-type intradyne receiver concept with feedforward carrier recovery," Journal of Lightwave technology, vol. 23, No. 2, pp. 802-808, Feb. 2005.
Matsui, Y., et al. "Widely tuneable modulated grating Y-branch Chirp Managed Laser," in Optical Communication, 2009. ECOC '09. 35th European Conference on , vol. 2009-Supplement, No. pp. 1-2, 20-24 Sep. 2009.
U.S. Appl. No. 12/789,350 and downloaded from PAIR (on Dec. 18, 2015), which is a priority application of U.S. Appl. No. 12/789,350 (Fredom.002A) which published as U.S. Publication No. 2010/0303469 on Dec. 2, 2010.
Adams et al. "Mach-Zehnder modulator integrated with a gain-coupled DFB laser for 10 Gbit/s, 100 km NDSF transmission at 1.55 µm," Electron. Lett., Feb. 29, 1996, vol. 32, No. 5, pp. 485-486.
Akulova et al., "Widely Tunable Electroabsorption-Modulated Sampled-Grating DBR Laser Transmitter", IEEE Journal of Selected Topics In Quantum Electronics, vol. 8, No. 6 , Nov.-Dec. 2002, pp. 1349-1357.
Anderson et al., "Indium Phosphide MZ chips are suited to long-reach metro", Laser Focus World, vol. 39 Issue: 3, Mar. 2003, pp. 101-104.
Barton J. S, et al., "Tailorable chirp using Integrated Mach-Zehnder modulators with tunable Sampled Grating Distributed Bragg Reflector lasers." 2002 IEEE 18th International Semiconductor Laser Conference, Conference Digest {Cat. No.02CH37390). paper No. TuB3, Garmisch, Germany, Sept. 29-Oct. 3, 2002, pp. 49-50.
Barton J.S. et al., "Photonic Integrated Circuits based on Sampled-Grating Distributed-Bragg-Reflector Lasers." Photonic Integrated Systems, Proceedings of SPIE, vol. 4998, 2003, pp. 43-54.
Barton, J. S. PhD, "The Integration of Mach-Zehnder Modulators with Sampled Grating DBR Lasers", Dissertation, Sep. 2004, 238 pages.
Barton, J. S. et al., "Monolithic Integration of Mach-Zehnder modulators with Sampled Grating Distributed Bragg Reflector lasers," Integrated Photonics Research Conference, paper No. 1FC3-1, Vancouver, Canada, Jul. 17-19, 2002, 3 pages.
Bauters et al., "Ultra-low-loss high-aspect-ratio Si3N4 waveguides," Optics Express, vol. 19, No. 4, Feb. 14, 2011, pp. 3163-3174.
Cartledge, J. C. et al., "Comparative Performance of Lightwave Systems Using Electro-Absorption Modulators and Semiconductor Mach-Zehnder Modulators," Proc LEOS'96, Boston, MA, 1996, paper WWI, pp. 170-171.
Cartledge, J. C. et al., "Theoretical Performance of 10 GB/s Lightwave Systems Using a 111-V Semiconductor Mach-Zehnder Modulator", IEEE Photon. Technol. Lett., vol. 6, No. 2, pp. 282-284.
Delansay, Ph. et al., "InP/GalnAsP phase-shifted Mach-Zehnder modulator for wavelength-independent (1530-1560nm) performance in 10 Gbit/s transmission over dispersive fiber," Proc. Conf. Optical FiberCommun., Dallas, TX, 1997, paperTuD1.
Delansay, Ph., et al., "10Gbit/s transmission over 90-127 km in the wavelength range 1530-1560nm using an InP-based Mach-Zehnder modulator," Electron. Lett., vol. 32, No. 19, pp. 1820-1821, Sep. 12, 1996.
Delorme, F. et al., "Butt-jointed DBR laser with 15 nm tunability grown in three MOVPE steps," Electronic Letters, vol. 31, No. 15, pp. 1244-1245, Jul. 20, 1995.
Guillemot, C. et al., "Transparent optical packet switching: The European ACTS KEOPS project approach," J. Lightw. Technol., vol. 16, No. 12, pp. 2117-2134, Dec. 1998.
Ishii, H., et al, "Quasicontinuous Wavelength Tuning in Super-Structure-Grating (SSG) DBR Lasers," IEEE Journal of Quantum Electronics, vol. 32, No. 3, pp. 433-441, Mar. 1996.
Ishii et al., "Multiple-phase-shift Super Structure Grating DBR Lasers For Broad Wavelength Tuning," IEEE Photon. Technol. Lett., vol. 5, No. 6, p. 613—615, Jun. 1993.
Kano, Y. et al., "Frequency control and stabilization of broadly tunable SSG-DBR lasers," in Proc. Opt. Fiber Commun. Cont., 2002, pp. 538-540.
Kim et al., "Chirp Characteristics of Dual-Drive Mach-Zehnder Modulator With a Finite DC Extinction Ratio," Photonics Technology Letters, IEEE, vol. 14 Issue: 3, Mar. 2002, pp. 298-300.
Lawetz et al., "Modulation Characteristics of Semiconductor Mach-Zehnder Optical Modulators", Journal of Lightwave Technology, vol. 15, No. 4, Apr. 1997, pp. 697-703.
Li et al., "Modeling and Design of a DFB Laser Integrated with a Mach-Zehnder Modulator," IEEE Journal of Quantum Electronics, vol. 34 Issue: 10, Oct. 1998, pp. 1807-1815.
Liang, D., et al., "Electrically-pumped compact hybrid silicon microring lasers for optical interconnects," Optics Express, vol. 17, No. 22, Oct. 2009, p. 20355-20364.
Liang et al., "Recent progress in lasers on silicon," Nature Photonics, No. 4, Aug. 2010, pp. 511-517.
Lovisa, S., et al., "Integrated Laser Mach-Zehnder Modulator on Indium Phosphide Free of Modulated-Feedback," IEEE Photonics Technology Letters, vol. 13, No. 12, Dec. 2001, pp. 1295-1297.
Mason et al., "Design of Sampled Grating DBR Lasers with Integrated Semiconductor Optical Amplifiers," IEEE Photon. Technol. Lett., vol. 12, No. 7, pp. 762-764, Jul. 2000.
Matsuo et al., "Integrated Filtered Feedback Tunable Laser using Double-Ring-Resonator-Coupled Filter," in Proc. 21st IEEE Int. Semicond. Laser Cont. (ISLC 2008), Paper WB7, pp. 155-156.
Matsuo et al., "Widely tunable laser using microring resonators," in Proc. 20th IEEE Int. Semicond. Laser Conf. (ISLC 2006), pp. 21-22, Paper TuB2.
Muller et al., "1.3-µm Continuously Tunable Distributed Feedback Laser with Constant Power Output Based on GainNAs—GaAs", Photonics Technology Letters, IEEE, vol. 15 No. 7, Jul. 2003, pp. 897-899.
Nicholes et al., "An 8 x 8 InP Monolithic Tunable Optical Router (MOTOR) Packet Forwarding Chip," Journal of Lightwave Technology, vol. 28, No. 4, Feb. 15. 2010, pp. 641-650.
Paniccia, "Integrating silicon photonics," Nature Photonics, www.nature.com/naturephotonics; vol. 4, Aug. 2010, pp. 498-499.
Penninckx et al., "Comparison of the Propagation Performance Over Standard Dispersive Fiber Between InP-Based TT-Phase-Shifted and Symmetrical Mach-Zehnder Modulators," IEEE Photonics Technology Letters, vol. 9, No. 9, Sep. 1997, pp. 1250-1252.
Raring et al., "Widely Tunable Negative-Chirp SG-DBR Laser/EA-Modulated Transmitter," Journal of Lightwave Technology., vol. 23, No. 1 ,Jan. 2005, pp. 80-86,.
Reid et al., "A novel broadband DBR laser for DWDM networks with simplified quasi-digital wavelength selection," Optical Fiber Communication Conference and Exhibit, Mar. 17-22, 2002, pp. 541-543.
Rigole et al., "Access to 20 Evenly Distributed Wavelengths Over 100 nm Using Only a Single Current Tuning in a Four-Electrode Monolithic Semiconductor Laser," IEEE Photon. Technol. Lett., vol. 7, Nov. 1995, pp. 1249-1251.
Rolland, C., "InGaAsP-based Mach-Zehnder modulators for high-speed transmission systems," Optical Fiber Communication Conference and Exhibit, 1998,Technical Digest, Feb. 22-27, 1998, pp. 283-284.
Rolland et al., "10 GB/s, 120km normal fiber transmission experiment using a 1.56 pm Muliple Quantum Well InP/lnGaAsP Mach-Zehnder modulator", OFC/OOC 1993, pp. 378-379.
Rolland et al., "10 Gbit/s, 1.56 µm Multiquantum Well InP/lnGaAsP Mach-Zehnder Optical Modulator," Electronics Letters, vol. 29, No. 5, pp. 471-472, Mar. 4, 1993.
Sano, H., et al., "High-speed InGaAs/InAIAs MQW Mach-Zehnder-type optical modulator", OFC/IOOC '93 Technical Digest, pp. 215-217.
Sasayama, K. et al., "FRONTIERNET: Frequency-Routing-Type Time-Division Interconnection network," Journal of Lightwave Technology, vol. 15, No. 3, Mar. 1997, pp. 417-429.

(56) References Cited

OTHER PUBLICATIONS

Segawa, T. et al., "Full C-Band Tuning Operation of Semiconductor Double Ring Resonator Coupled Laser With Low Turning Current," IEEE Photonics Technology Letters, vol. 19, No. 17, Sep. 2007, pp. 1322-1324.
Segawa, T. et al., "Tunable Double-ring-resonator-coupled Laser over Full C-band with Low Tuning Current," in Proc. 19th Indium Phosphide Related Mater. Conf. (IPRM May 2007), pp. 598-601.
Segawa, T. et al.,"Monolithically Integrated Filter-Free Wavelength Converter With Widely Tunable Double-Ring Resonator Coupled Laser," in Proc. 20th Indium Phosphide Related Mater. Conf. {IPRM 2008), Versailles, Fran-ce, Paper TuA 1.2, 4 pages.
Shibata, Y. et al. "Monolithically Integrated Parallel-Amplifier Structure For Filter-Free Wavelength Conversion," Jpn. J. Appl. Phys., vol. 41, Feb. 2002, pp. 1194-1198.
Summers, Joseph A. et al., "Concave Low-Loss Total Internal Reflection Mirrors in Indium Phosphide for High Fabrication Tolerance," Conference Paper, Conference on Lasers and Electro-Optics, Baltimore, Maryland, May 6, 2007, Integrated Optics (CTuH), 2 pages.
Todt, R. et al., "Demonstration of Vernier effect tuning in tunable twin-guide laser diodes," Proc. Inst. Electr. Eng. Optoelectron., vol. 152, No. 2, 2005, pp. 66-71.
Yamashita, S. et al., "High-performance single-frequency fibre Fabry-Perot laser (FFPL) with selfinjection locking," Electronics Letters, vol. 35, No. 22, Oct. 28, 1999, pp. 1952-1954.
Yu, J. et al., "Phase-Engineered 111 -V MQW Mach-Zehnder Modulators," IEEE Photonics Technology Letters, vol. 8 No. 8, Aug. 1996, pp. 1018-1020.
Zucker, J. E., et al., "Quantum Well Interferometric Modulator Monolithically Integrated With 1.55 Full Tunable Distributed Bragg Reflector Laser," Electronics Letters, vol. 28, No. 20, Sep. 24, 1992, pp. 1888-1889.
Zucker, J.E., "Monolithically Integrated Laser/Mach-Zehnder Modulators Using Quantum Wells, Lasers and Electro-Optics," Society Annual Meeting, LEOS '93 Conference Proceedings. IEEE, Nov. 15-18, 1993, pp. 641-642.
Amendment filed Jul. 21, 2017 in U.S. Appl. No. 15/046,969.
Notice of Allowance dated Oct. 14, 2015 in U.S. Appl. No. 14/267,582.
Notice of Allowance dated Sep. 9, 2015 in U.S. Appl. No. 14/263,855.
Notice of Allowance dated Jun. 2, 2015 in U.S. Appl. No. 14/263,855.
Notice of Allowance dated Jun. 9, 2015 in U.S. Appl. No. 14/267,582.
Notice of Allowance dated Sep. 27, 2017 in U.S. Appl. No. 15/046,969.
Supplemental Amendment filed Sep. 14, 2017 in U.S. Appl. No. 15/046,969.
Beck et al., "Buried Heterostructure Quantum Cascade Lasers with a Large Optical Cavity Waveguide," IEEE Photonics Technology Letters, vol. 12, No. 11, Nov. 2000; 3 pages. Pages 1450-1452.
Donnelly et al., "AIGaAs—InGaAs Slab-Coupled Optical Waveguide Lasers," IEEE Journal of Quantum Electronics, vol. 29, No. 2, Feb. 2003; 10 pages.

Juodawlis et al., "High-Power 1.5-µm InGaAsP—lnP Slab-Coupled Optical Waveguide Amplifier," IEEE Photonics Technology Letters, vol. 17, No. 2, Feb. 2005; 3 pages.
Juodawlis et al., "Continuous-wave two-photon absorption in a Watt-class semiconductor optical amplifier," Optics Express, vol. 16, No. 16, Aug. 4, 2008; 10 pages.
Juodawlis et al., "High-Power, Low-Noise 1.5-µm Slab-Coupled Optical Waveguide (SCOW) Emitters: Physics, Devices, and Applications," IEEE Journal of Selected Topics in Quantum Electronics, vol. 17, No. 6, Nov./Dec. 2011; 17 pages.
Juodawlis et al., "High-Power, Low-Noise Slab-Coupled Optical Waveguide (SCOW) Amplifiers and Lasers," Optical Society of America, OFC/NFOEC 2011; 3 pages.
Juodawlis et al., "High-Power, Ultralow-Noise Semiconductor External Cavity Lasers Based on Low-Confinement Optical Waveguide Gain Media," Proc. Of SPIE, vol. 7616; 10 pages.
Juodawlis et al., "Ultralow-Noise Packaged 1.55-µm Semiconductor External-Cavity Laser with 0.37-W Output Power," Optical Society of America, CLEO/IQEC 2009; 3 pages.
Juodawlis et al., "Gain-Power Trade-Off in Low-Confinement Semiconductor Optical Amplifiers," IEEE NUSOD 2007; CPDA3, 2 pages.
Klamkin et al., "High-Output Saturation Power Variable Confinement Slab-Coupled Optical Waveguide Amplifier," Optical Society of America, OFC/NFOEC 2011; 3 pages.
Liang et al., "High-Efficiency Oxide-Confined Ridge Waveguide Laser with Nearly Symmetric Output Beam," IEEE 2006; 2 pages.
Loh et al., "Noise Figure of Watt-Class Ultralow-Confinement Semiconductor Optical Amplifiers," IEEE Journal of Quantum Electronics, vol. 47, No. 1, Jan. 2011; 10 pages.
Loh et al., "Packaged, High-Power, Narrow-Linewidth Slab-Coupled Optical Waveguide External Cavity Laser (SCOWECL)," IEEE Photonics Technology Letters, vol. 23, No. 14, Jul. 15, 2011; 3 pages.
Madison et al., "Slab-Coupled Optical Waveguide Photodiode," Optical Society of America, CLEO/QELS 2008; 2 pages.
Marcatili E. A. J., "Slab-Coupled Waveguides," The Bell System Technical Journal, vol. 53, No. 4, Apr. 1974; 30 pages.
Pietrzak et al., "Combination of Low-Index Quantum Barrier and Super Large Optical Cavity Designs for Ultranarrow Vertical Far-Fields From High-Power Broad-Area Lasers," IEEE Journal of Selected Topics in Quantum Electronics, vol. 17, No. 6, Nov./Dec. 2011; 8 pages.
Ru et al., "Robust slab-coupled buried-rub semiconductor laser with high fibre coupling efficiency," IEE, Sep. 27, 2004; 2 pages.
Ryvkin B.S. and Avrutin, E.A., "Effect of carrier loss through waveguide layer recombination of the internal quantum efficiency in large-optical-cavity laser diodes," Journal of Applied Physics 97, 113106, 2005; 6 pages.
Walpole et al., "Slab-Coupled 1.3-µm Semiconductor Laser With Single-Spatial Large-Diameter Mode," IEEE Photonics Technology Letters, vol. 14, No. 6, Jun. 2002; 3 pages.

* cited by examiner

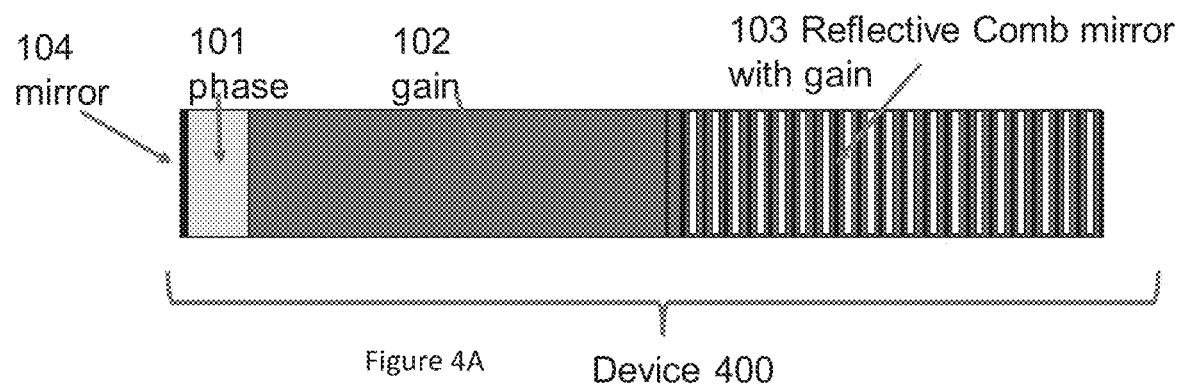
Figure 4A   Device 400
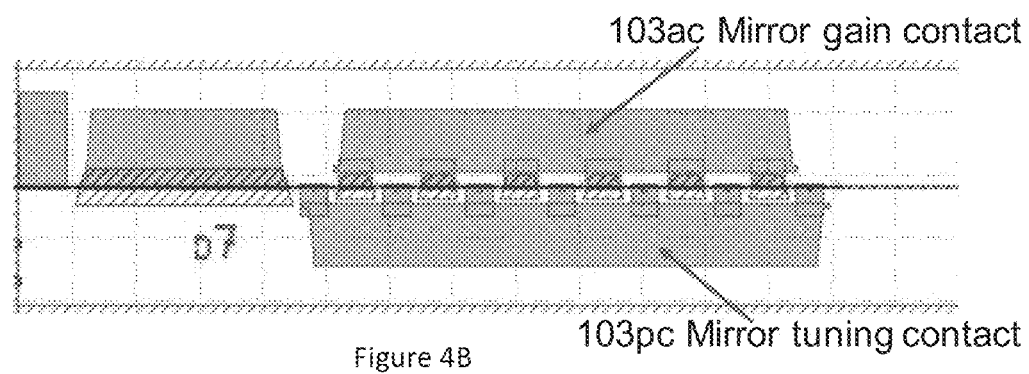
Figure 4B

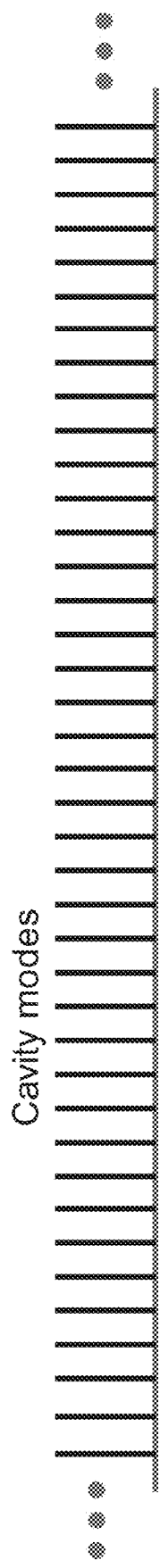
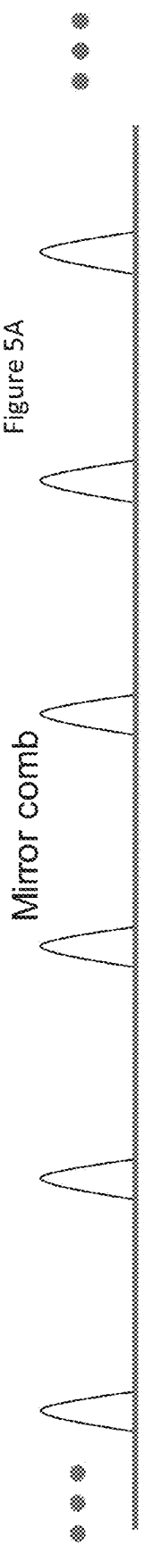
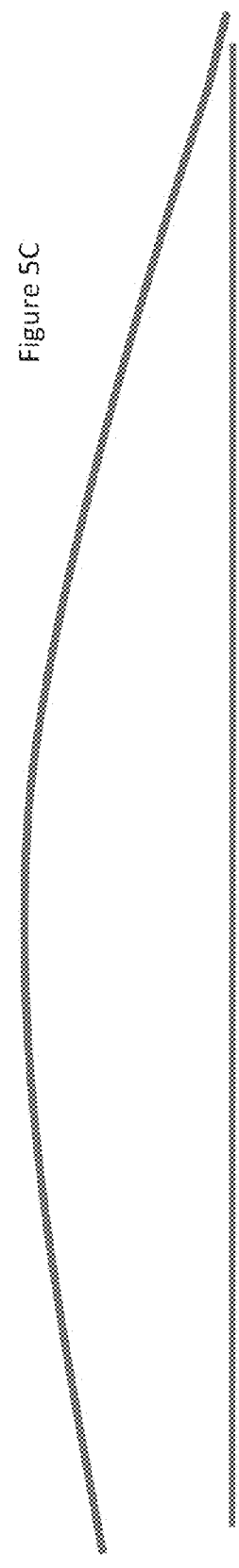
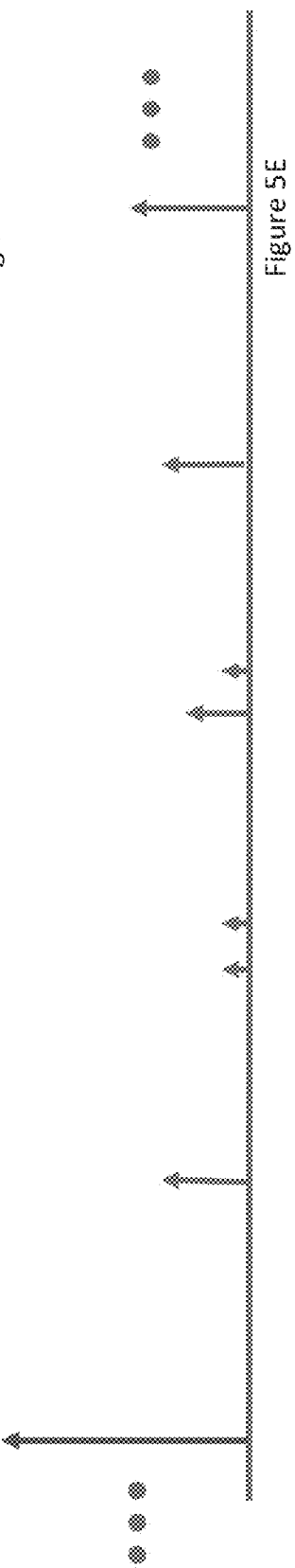
Figure 5A — Cavity modes
Figure 5B — Mirror comb
Figure 5C — Cavity mode selection by comb
Figure 5D
Figure 5E

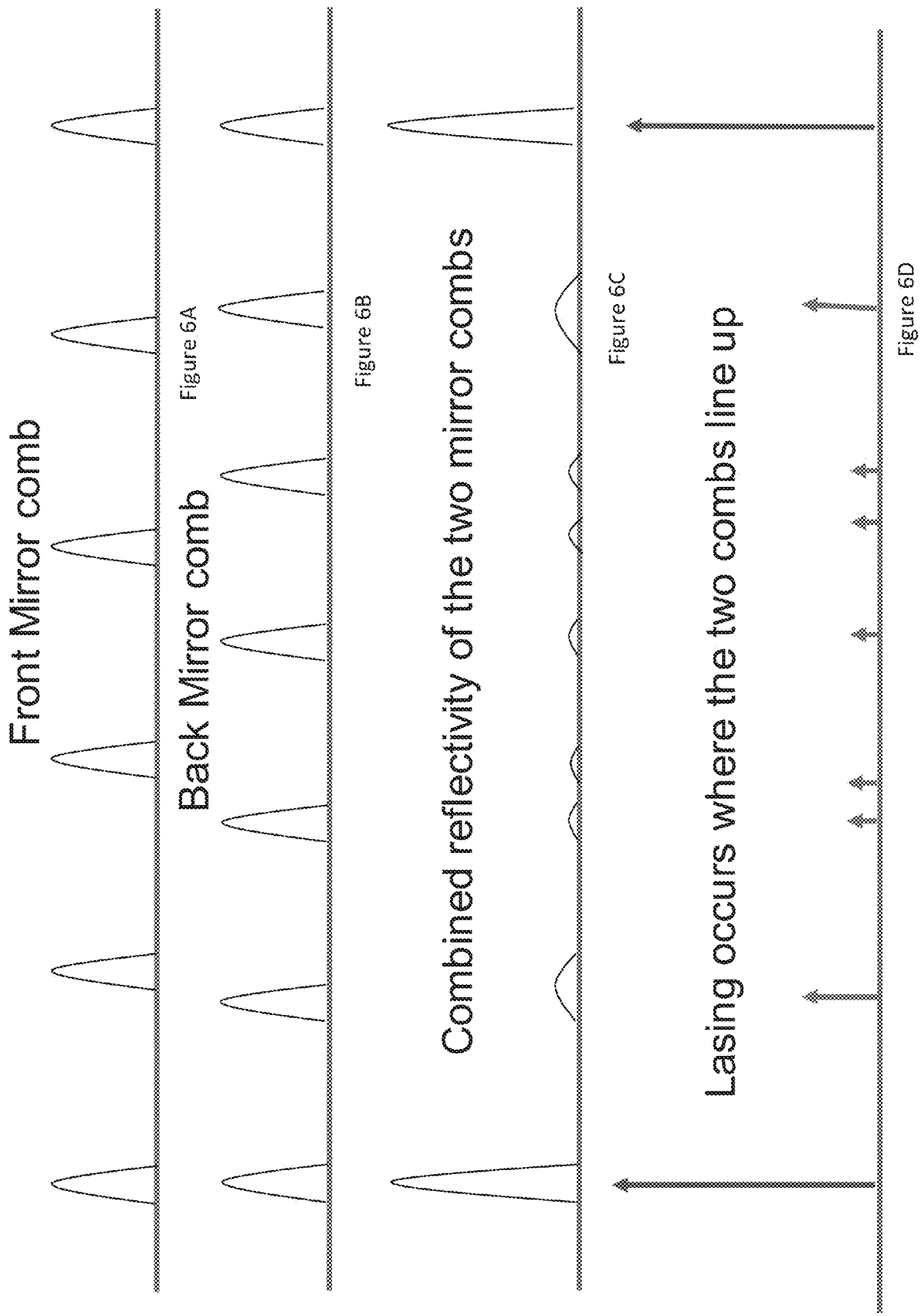

TUNABLE LASER

CROSS-REFERENCE TO RELATED APPLICATIONS

This application is a continuation of U.S. patent application Ser. No. 15/938,842 filed Mar. 28, 2018 which claims the benefit under 35 U.S.C. § 119(e) of U.S. Provisional Appl. No. 62/477,908 filed on Mar. 28, 2017, U.S. Provisional Appl. No. 62/489,922 filed on Apr. 25, 2017, and U.S. Provisional Appl. No. 62/596,655 filed on Dec. 8, 2017. Each of the above-identified application is hereby expressly incorporated by reference herein in its entirety.

BACKGROUND

Field

Various embodiments of this application relate to the field of tunable lasers.

Description of the Related Art

Tunable lasers are widely used in telecommunications, sensing, and test and measurement applications. Semiconductor tunable lasers are particularly useful for their small size and low power consumption. One example of a semiconductor tunable laser is a sampled grating distributed Bragg reflector laser (SGDBR) which uses Vernier tuning of two SGDBR (sampled grating distributed Bragg reflector) mirrors. In various embodiments, the sampled grating distributed Bragg reflectors can include a plurality of distributed Bragg reflectors which cumulatively produce a comb of reflections. The full width half maximum and reflection strength of the comb can be tailored by various design parameters including grating burst length, number of bursts, spacing between bursts coupling coefficient, etc. Various other embodiments of tunable lasers include Y branch configurations of the above, digital supermode distributed Bragg reflectors, coupled cavity designs, and tunable grating-coupler designs.

SUMMARY

Systems and methods that enable an optical transmitter capable of generating optical signals with various modulation formats may be beneficial in optical networks and systems. Example embodiments described herein have several features, no single one of which is indispensable or solely responsible for their desirable attributes. Without limiting the scope of the claims, some of the advantageous features will now be summarized.

Various embodiments of a tunable laser described herein comprise a laser cavity formed between a broadband mirror and a comb reflector. The laser cavity includes a gain section and an optional phase section. Such embodiments of a tunable laser can achieve a wide wavelength tuning range by utilizing a Vernier effect between cavity modes of the laser cavity and the modes of the comb reflector.

Various embodiments of a tunable laser described herein comprise a Y-branch laser comprising a first branch comprising a first reflector, a gain section and a comb reflector and a second branch comprising a second reflector, an optional phase section and a comb reflector. Wavelength tuning in the Y-branch can be achieved by using a Vernier effect between cavity modes of the laser cavity formed by the first and the second branches and the modes of the comb reflector.

Various embodiments of tunable lasers described herein comprise a laser cavity formed by a comb reflector comprising an optically active material (e.g., gain material). In various embodiments, the laser cavity can comprise lenses or other optical components within the laser cavity. In various embodiments, the laser cavity can be configured as an external cavity laser.

Various embodiments of tunable lasers comprising a comb reflector can be integrated (e.g., monolithically integrated) with additional optical components and/or devices as a photonic integrated circuit. For example, various embodiments of tunable lasers comprising a comb reflector can be monolithically integrated with a semiconductor optical amplifier and/or a modulator (e.g., an electroabsorption modulator (EAM) or a Mach-Zehnder type modulator). The modulator can be configured for direct modulation of light from the tunable laser at bit-rates greater than or equal to about 1 Gbps, greater than or equal to about 2.5 Gbps, greater than or equal to about 10 Gbps, greater than or equal to about 40 Gbps, greater than or equal to about 100 Gbps, greater than or equal to about 256 Gbps, or values in between any of these values.

One innovative aspect of the subject matter of this application includes a wavelength tunable laser comprising a gain medium; a reflective comb mirror disposed at one side of the gain medium, the reflective comb mirror having a plurality of reflection peaks; and a broadband reflector disposed at another side of the gain medium. The reflective comb mirror and the broadband reflector form a laser cavity formed having a plurality of cavity modes. The reflective comb mirror is configured to be electrically or thermally tuned such that at least one of the plurality of reflection peaks overlaps with one of the plurality of cavity modes to generate a laser signal. The reflective comb mirror can comprise additional gain material separate from said gain medium. For example, the reflective comb mirror can comprise one or more sections comprising additional gain material separate from said gain medium. In various embodiments, the gain medium can comprise the reflective comb mirror.

Another innovative aspect of the subject matter of this application is embodied in a wavelength tunable laser comprising a laser cavity formed by a reflective comb mirror and a broadband reflector. The reflective comb mirror has a plurality of reflection peaks. The laser cavity comprises a gain medium. The laser cavity has a plurality of cavity modes. The laser cavity comprises a phase section that is configured to introduce a change in optical path of an optical signal in the laser cavity. The phase section and/or the reflective comb mirror are configured to be electrically or thermally tuned such that at least one of the plurality of reflection peaks of the reflective comb mirror overlaps with one of the plurality of cavity modes to produce a laser signal.

Another innovative aspect of the subject matter discussed herein is embodied in a wavelength tunable laser comprising a gain region comprising a gain medium; a comb mirror disposed at one side of the gain region, the comb mirror having a plurality of reflection peaks; and a broadband mirror disposed at another side of the gain region. A laser cavity formed by the comb mirror and the broadband mirror has a plurality of cavity modes. The comb mirror is configured to be electrically or thermally controlled such that at least one of the plurality of reflection peaks overlaps with one of the plurality of cavity modes.

In various embodiments of the tunable laser, the gain region, the comb mirror and the broadband mirror can be disposed on a substrate comprising at least one waveguide. The substrate can comprise a crystalline material. The gain region can comprise a multi-quantum well semiconductor heterojunction. Various embodiments of the tunable laser can be configured as a semiconductor laser. The comb mirror can comprise one or more regions comprising gain medium. The one or more regions comprising gain medium can be separate from the gain region. The comb mirror can comprise one or more regions that are devoid of the gain medium. In various embodiments, the gain region can comprise the comb mirror. The tunable laser can further comprise a phase section configured to introduce a change in optical path of an optical signal in the laser cavity. The phase section can be configured to be electrically or thermally controlled such that at least one of the plurality of reflection peaks overlaps with one of the plurality of cavity modes. In various embodiments of the laser, two or more reflection peaks of the comb mirror can be accommodated in a gain bandwidth of the gain region. In various embodiments, a length of the laser cavity can be configured such that a non-integer number of cavity modes are between two consecutive reflection peaks of the comb mirror. In various embodiments, the broadband mirror can comprise a cleaved facet.

Yet another innovative aspect of the subject matter discussed herein is embodied in a wavelength tunable laser comprising a crystalline substrate; a waveguide on the crystalline substrate; a first reflector at one end of the waveguide, a second reflector at another end of the waveguide, and a gain region in a cavity formed by the first and the second reflectors. The first reflector comprises a plurality of reflective regions and has a plurality of reflection peaks in a wavelength range. The second reflector has substantially uniform reflectivity for wavelengths in the wavelength range. The gain region comprises a gain medium. The gain region has a gain peak in the wavelength range, the gain peak having a maximum gain; and a gain bandwidth equal to a width of the gain peak at 50% of the maximum gain. The cavity formed by the first and the second reflectors has a plurality of cavity modes. A length of the cavity is configured such that a non-integer number of cavity modes are between consecutive reflection peaks of the first reflector. In some embodiments, the wavelength range can be between about 650 nm and about 1950 nm. In some other embodiments, the wavelength range can comprise at least one of a first range from about 1250 nm and about 1360 nm, a second range from about 1500 nm and about 1580 nm, or a third range from about 1600 nm and about 1700 nm. Various embodiments of the tunable laser can further comprise one or more electrodes configured to provide electrical current or voltage to move the reflection peaks of the first reflector with respect to the cavity modes to select a desired lasing wavelength. In some embodiments, two or more reflection peaks of the first reflector can be within the gain bandwidth. The first reflector can be a comb mirror and the second reflector can be a broadband mirror.

Various embodiments described herein comprise a laser cavity formed by a broadband reflector having a spectral reflectivity curve with a bandwidth between about 20 nm and about 300 nm, a comb mirror having a plurality of reflection peaks, the bandwidth of an individual reflection peak from the plurality of reflection peaks being less than about 10 nm. The wavelength distance between consecutive reflection peaks of the comb mirror (also referred to as free spectral range (FSR) of the comb mirror) can be less than about 50 nm. The laser cavity comprises a gain region between the broadband reflector and the comb mirror. The laser cavity has a plurality of cavity modes. The optical path length is configured adjust the spacing between cavity modes of the laser cavity such that a non-integer number of cavity modes are present between two consecutive reflection peaks of the comb mirror. In various embodiments, two or more reflection peaks of the comb mirror can occur within a gain bandwidth of the laser cavity. In various embodiments, the laser cavity can comprise a phase section which can be used to change a wavelength of a laser signal output from the laser cavity. For example, electrical voltage and/or electrical current can be applied to the phase section to change the wavelength of the laser signal output from the laser cavity. As another example, the phase section can be heated or cooled to change the wavelength of the laser signal output from the laser cavity. In some implementations, position of the plurality of reflection peaks of the comb mirror can be changed to change the wavelength of the laser signal output from the laser cavity. The position of the plurality of reflection peaks of the comb mirror can be changed by applying electrical current or electrical voltage to the comb mirror. In various embodiments, the laser cavity comprising the gain region, the broadband reflector and the comb mirror can be formed on a substrate comprising a waveguide layer. In various embodiments, the substrate can be a crystalline substrate. In various embodiments, the laser cavity comprising the gain region, the broadband reflector and the comb mirror can be monolithically integrated on a substrate comprising a waveguide layer.

The reflective comb mirror can comprise additional gain material separate from the gain medium in the laser cavity. The reflective comb mirror can comprise one or more sections comprising additional gain material separate from the gain medium. In various embodiments, the gain medium of the laser cavity can comprises the reflective comb mirror.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the following description of the various embodiments, reference is made to the accompanying drawings which form a part hereof, and in which is shown by way of illustration various embodiments of the device.

It is to be understood that other embodiments may be utilized and structural changes may be made without departing from the scope of present invention.

Figure 1:
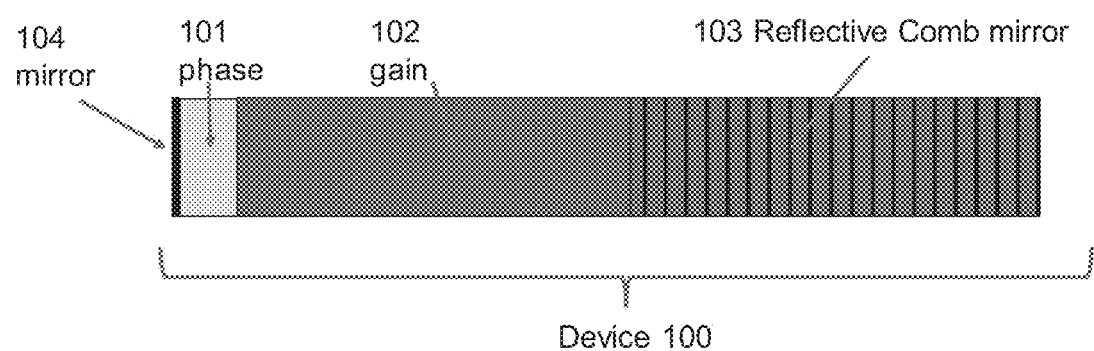

FIG. 1 schematically illustrates an embodiment of a tunable laser comprising a comb reflector.

Figure 2:
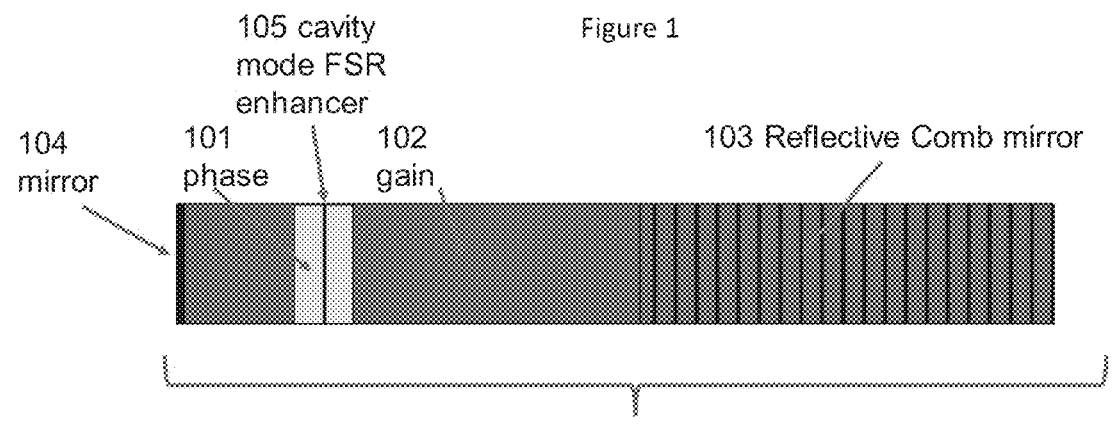

FIG. 2 schematically illustrates an embodiment of a tunable laser comprising a comb reflector and a free spectral range (FSR) enhancing section.

Figure 3:
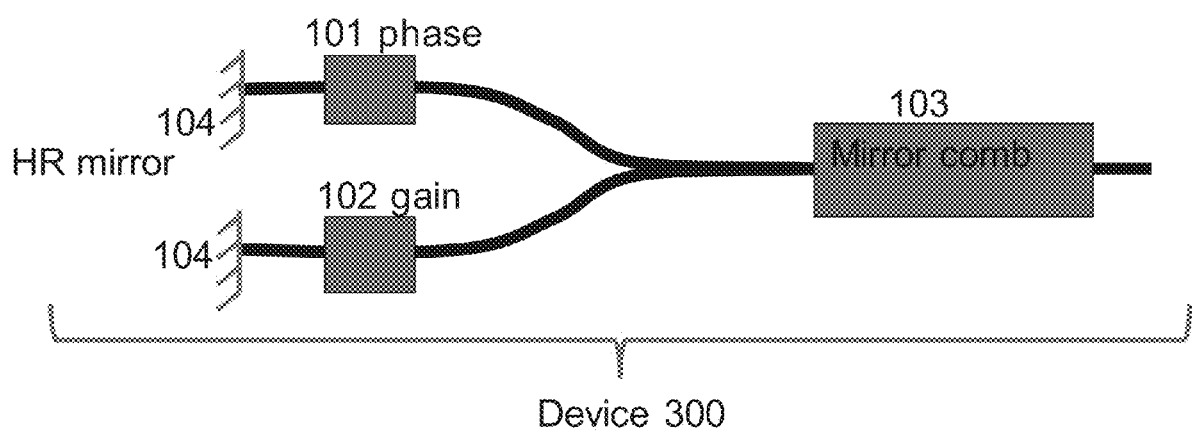

FIG. 3 schematically illustrates an embodiment of a Y-branch laser comprising a comb reflector.

FIG. 4A schematically illustrates an embodiment of a tunable laser comprising a comb reflector with a plurality of sections comprising gain medium. FIG. 4B schematically illustrates an embodiment of a mask layer showing electrical contact regions configured to provide electrical current or voltage to the different portions of the tunable laser illustrated in FIG. 4A.

FIGS. 5A-5E schematically illustrate tuning operation of an embodiment of a tunable laser comprising a comb reflector.

FIGS. 6A-6D schematically illustrate a process of mode selection in a sampled grating distributed Bragg reflector (SGDBR) laser.

Figure 7:
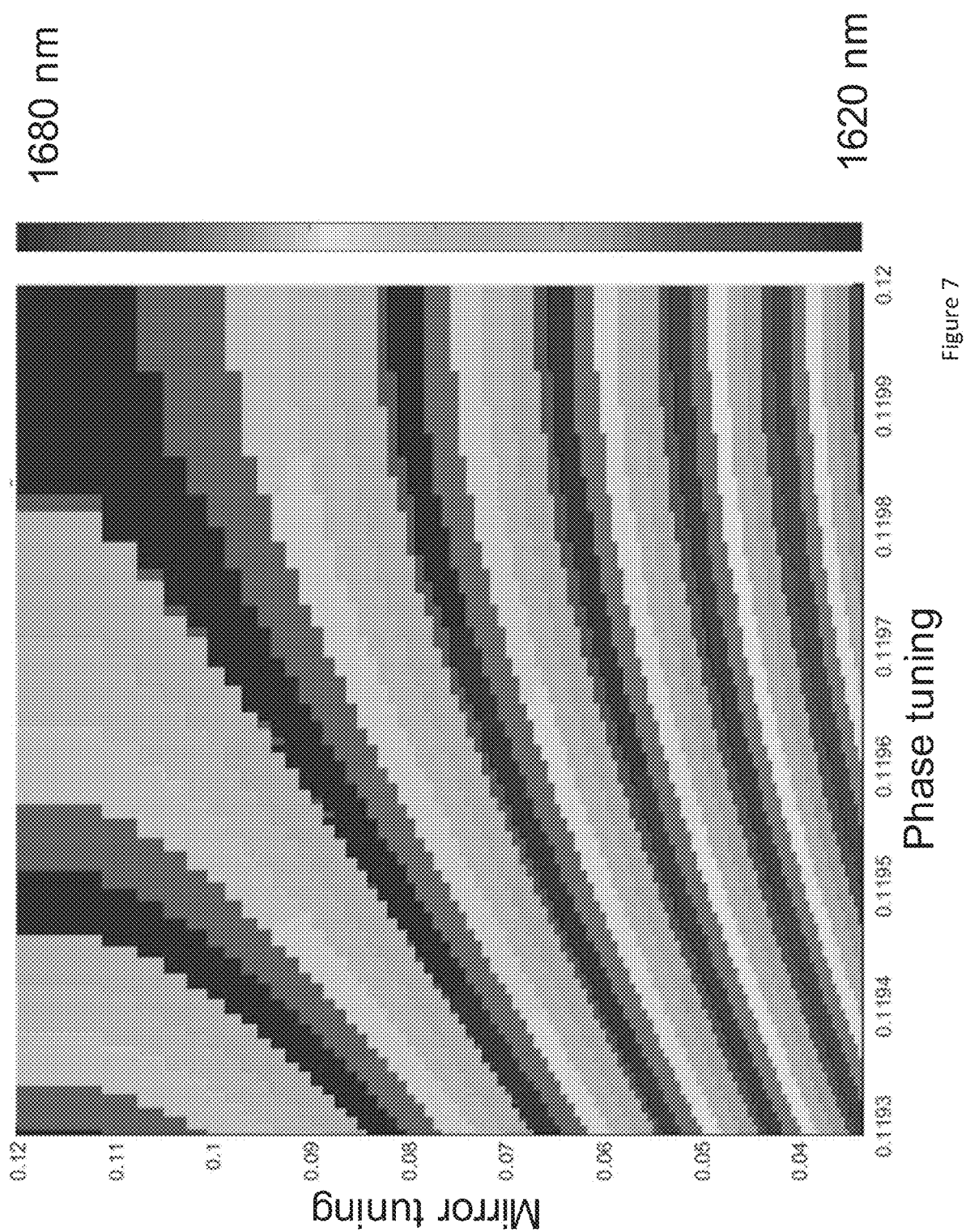

FIG. 7 is a wavelength map generated by simulating the operation of a tunable laser comprising a comb reflector.

Figures 2, 8A:
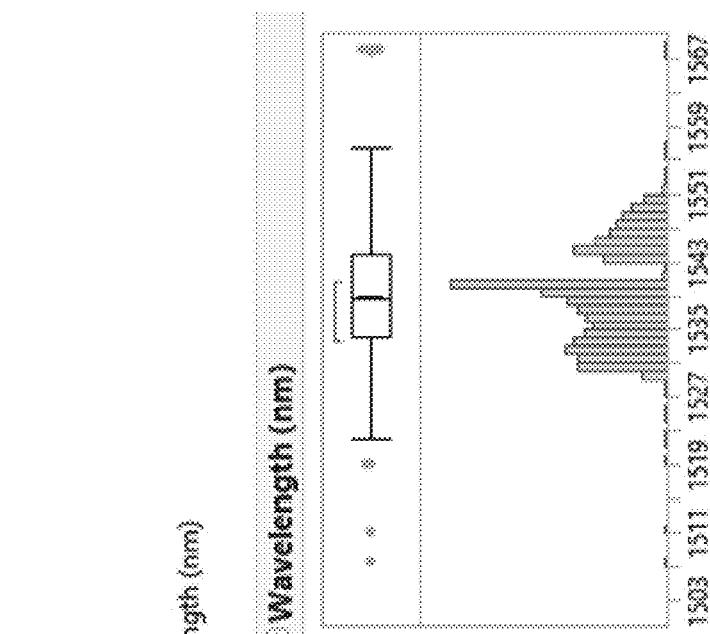
Figures 1, 8A:
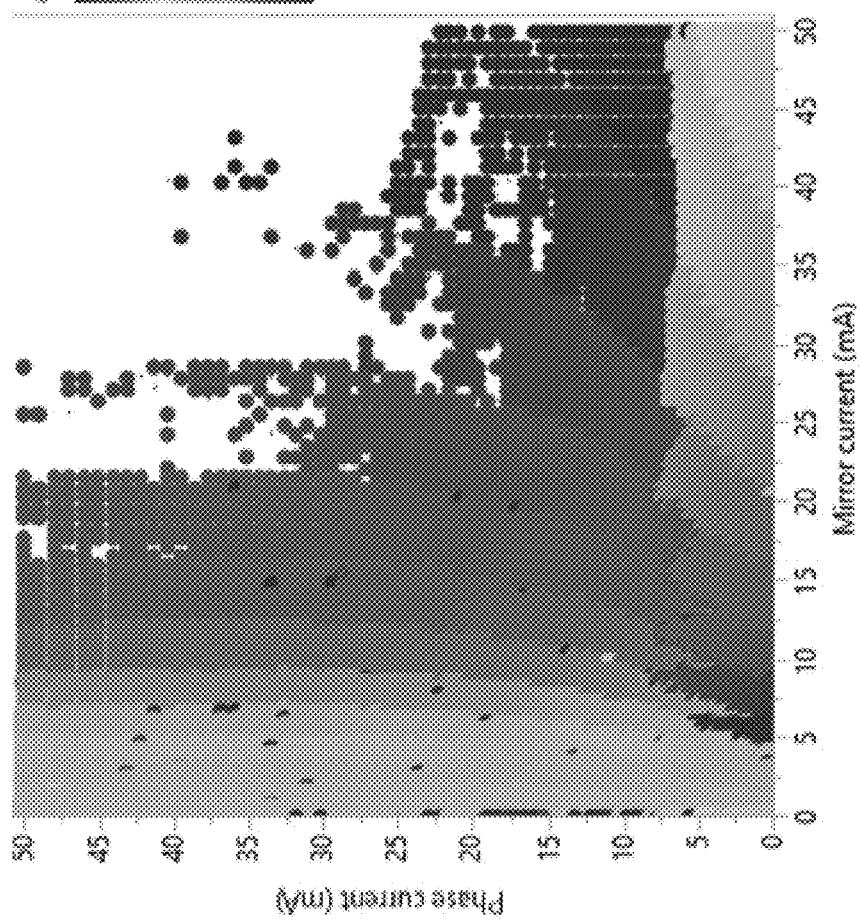

FIGS. 8A-1 and 8A-2 illustrate the variation in the wavelength of light output from an embodiment of a tunable laser comprising a comb reflector for different operating conditions.

Figure 9A:
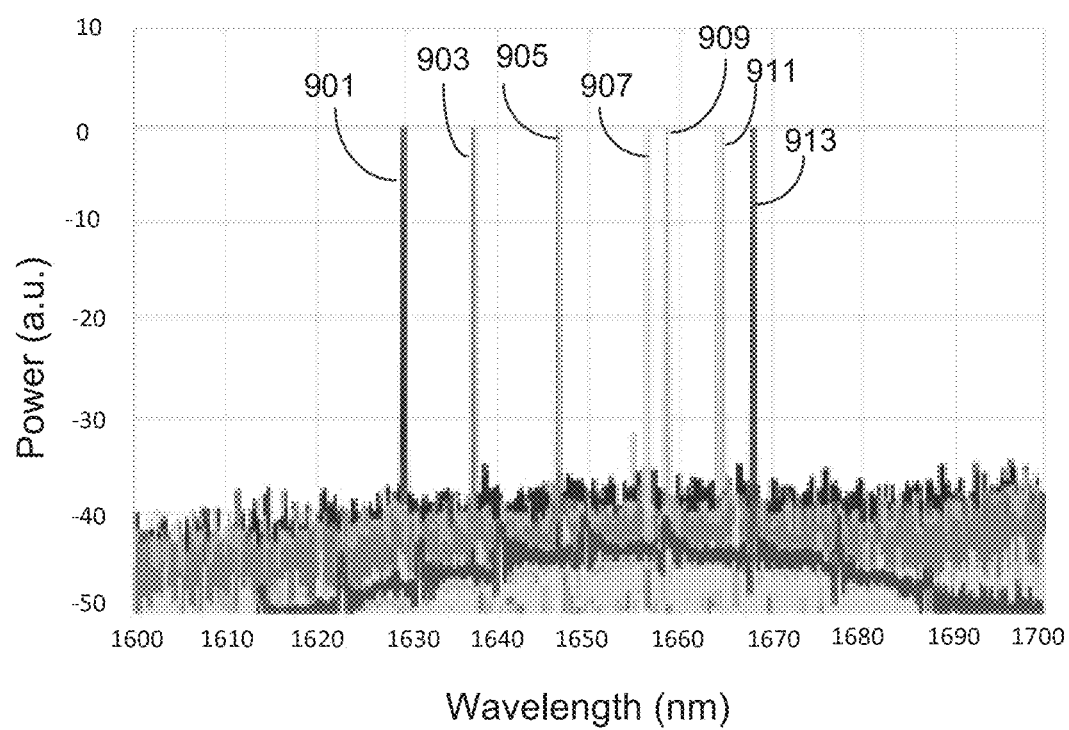
Figures 1, 9B:
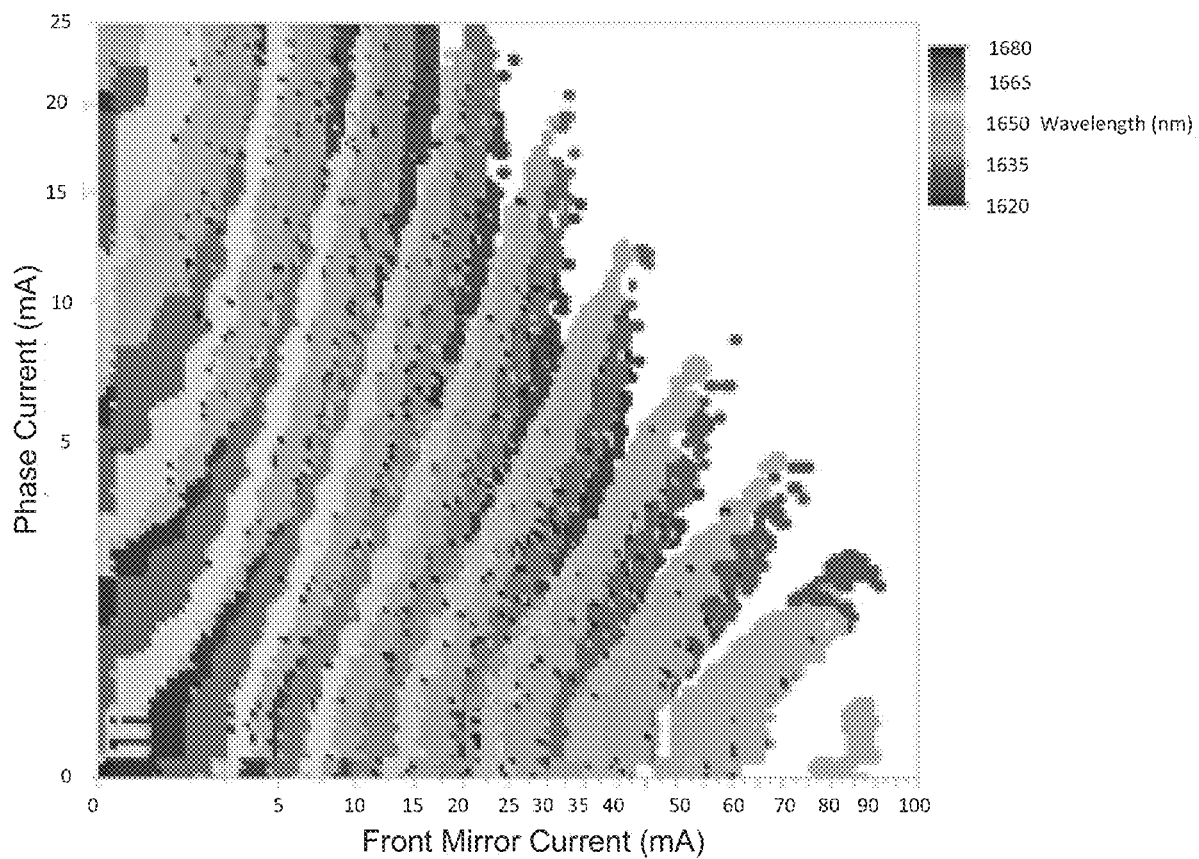
Figures 2, 9B:
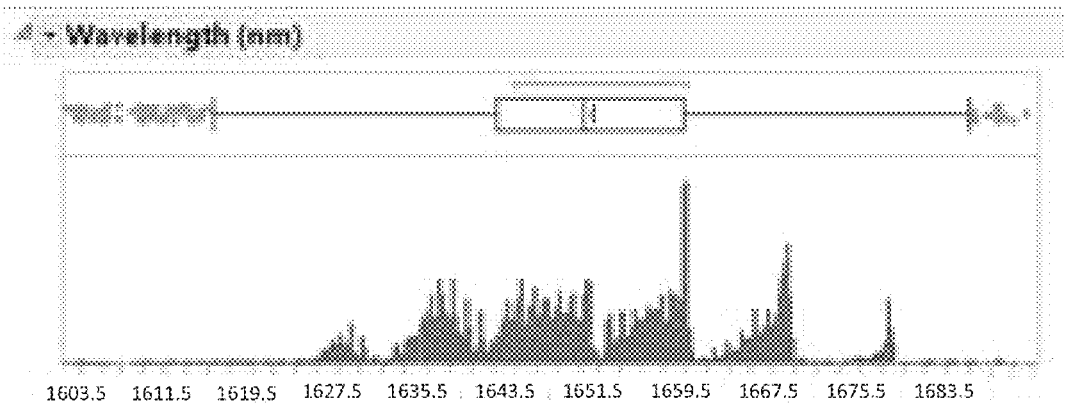

FIG. 9A illustrates the wavelength of light output from an embodiment of a tunable laser comprising a comb reflector at different operating conditions. FIGS. 9B-1 and 9B-2 illustrate the variation in the wavelength of light output from an embodiment of a tunable laser comprising a comb reflector at different operating conditions.

Figure 10:
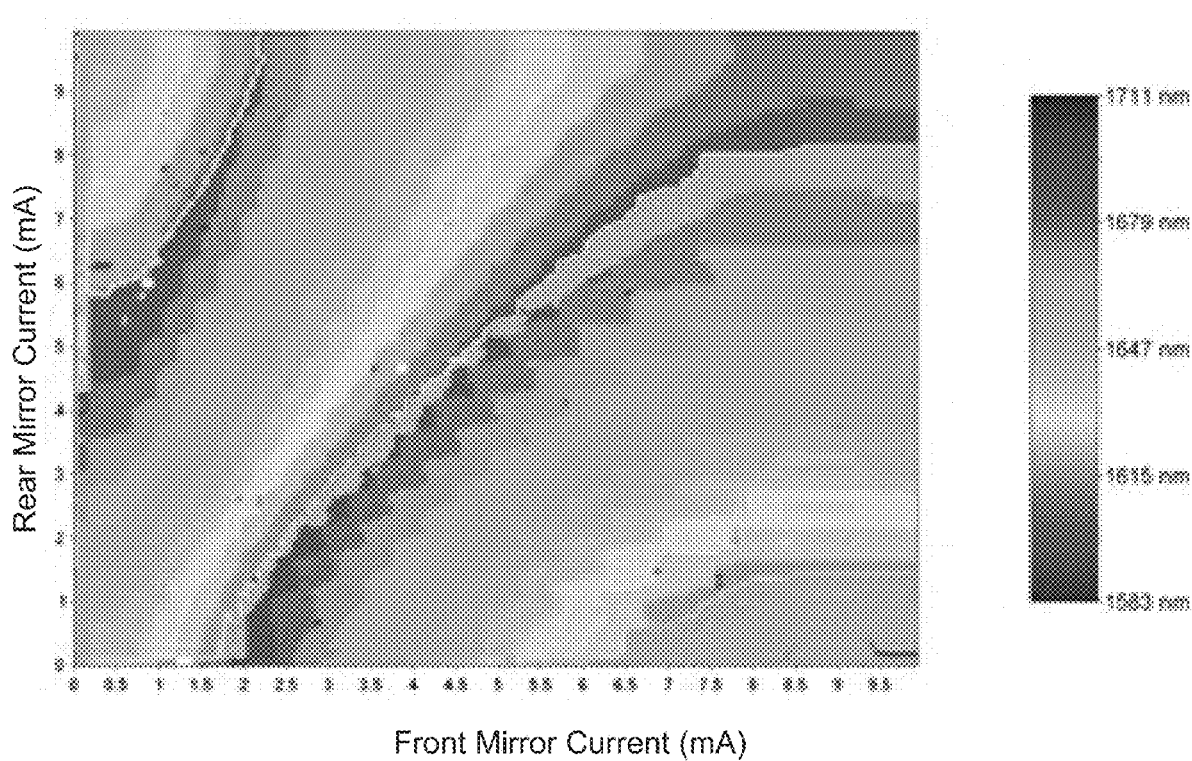

FIG. 10 is the variation in the wavelength of light output from an embodiment of a tunable laser comprising a sampled grating distributed Bragg reflector (SGDBR) laser at both ends of a laser cavity for different operating conditions.

These and other features will now be described with reference to the drawings summarized above. The drawings and the associated descriptions are provided to illustrate embodiments and not to limit the scope of the disclosure or claims. Throughout the drawings, reference numbers may be reused to indicate correspondence between referenced elements. In addition, where applicable, the first one or two digits of a reference numeral for an element can frequently indicate the figure number in which the element first appears.

DETAILED DESCRIPTION

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied using a variety of techniques including techniques that may not be described herein but are known to a person having ordinary skill in the art. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein. It will be understood that when an element or component is referred to herein as being "connected" or "coupled" to another element, it can be directly connected or coupled to the other element or intervening elements may be present therebetween. For clarity of description, "reflector" or "mirror" can be used interchangeably to refer to an optical element and/or a surface having a reflectivity greater than or equal to about 0.01% and less than or equal to 100% including any value in between.

A new innovative tunable semiconductor laser is contemplated herein that offers advantages of simpler tuning mechanism as well as lower power consumption. Various embodiments of tunable lasers described herein can be tuned with fewer controls (e.g., one or two controls). Various embodiments of the innovative tunable laser described herein comprise a comb mirror to define a series of selectable lasing modes each of which can be continuously tuned over a short wavelength range. The tunable laser can be configured to output a laser signal having a desired wavelength by selecting a lasing mode of the comb mirror that is closest to the desired wavelength and tuning the selected mode to the desired wavelength by temperature tuning and/or electrical tuning. The tuning range of the innovative tunable laser comprising a comb mirror can be greater than or equal to about 5 nm, greater than or equal to about 10 nm, greater than or equal to about 20 nm, greater than or equal to about 50 nm, greater than or equal to about 100 nm, less than or equal to about 200 nm, less than or equal to about 300 nm, less than or equal to about 500 nm, or have any value in a range or sub-range defined by any of these values.

One possible embodiment of the innovative tunable semiconductor laser device is shown in FIG. 1. The laser comprises a gain region 102, a broadband mirror 104 disposed at one end of the gain region 102 and a comb reflector 103 disposed at another end of the gain region 102. The gain region 102 can comprise an optically active material. For example, the gain region 102 can comprise multi-quantum well heterojunctions formed in semiconductor materials, such as, for example, III-V semiconductor materials. The broadband mirror 104 can be a cleaved facet coated with reflective coatings, cleaved facet without any coating or any other broadband reflector. The broadband mirror 104 is disposed at one end of a gain region 102. The broadband mirror 104 can be configured to reflect wavelengths in a broad spectral range substantially uniformly such that the reflectivity of the broadband mirror 104 is within ±10% of an average reflectivity for wavelengths in a wide wavelength range that extends between about 20 nm and about 500 nm. The spectral reflectivity (e.g., reflectivity versus wavelength) curve of the broadband mirror 104 can have a bandwidth (e.g., full width at half maximum (FWHM)) of about 20 nm, about 50 nm, about 100 nm, about 200 nm, about 300 nm, about 500 nm, about 1 micron, about 3 microns, about 10 microns, or any range or combination of ranges between any of these values. Accordingly, the broadband mirror 104 can be configured to substantially uniformly reflect wavelengths between about 300 nm and about 20 microns, between about 300 nm and about 15 microns, between about 300 nm and about 10 microns, between about 300 nm and about 7 microns, between about 300 nm and about 3.5 microns, between about 300 nm and about 1.9 microns, between about 300 nm and about 1.5 microns, between about 1.5 microns and about 1.9 microns, between about 1.3 microns and about 1.5 microns, between about 1.5 microns and about 1.7 microns between about 300 nm and about 1.3 microns, between about 300 nm and about 1.0 micron, between about 300 nm and about 980 nm, between about 300 nm and about 760 nm, between about 300 nm and about 600 nm, between about 400 nm and about 590 nm, or any wavelength range in these ranges/sub-ranges formed by any of these values. The broadband mirror 104 can be configured to reflect between about 0.1% to about 99.9% of incident light. For example, the broadband mirror 104 can be configured to reflect an amount greater than about 20% of incident light, an amount greater than about 30% of incident light, an amount greater than about 40% of incident light, an amount greater than about 50% of incident light, an amount greater than about 60% of incident light, an amount greater than about 75% of incident light, an amount greater than about 85% of incident light, an amount greater than about 95% of incident light, an amount less than about 99% of incident light, or any range or combination of ranges between any of these values. The broadband mirror 104 can be configured to provide significant reflection (e.g., between about 1%-99.9%) across the full wavelength tuning range of the tunable laser. Without any loss of generality, the broadband mirror 104 is not considered to be a sampled grating distributed Bragg reflector. Without any loss of generality, the bandwidth of the spectral reflectivity of the broadband mirror 104 can be substantially greater (e.g., greater than or equal to 10 nm, greater than or equal to 20 nm, greater than or equal to 30 nm, greater than or equal to 50 nm) than bandwidth of the spectral reflectivity of a sampled grating distributed Bragg reflector.

In various embodiments, the comb mirror 103 can be a periodically chirped reflector or a superstructure grating or mirror. In some embodiments, the comb mirror 103 can comprise a sampled grating distributed Bragg reflector. The comb mirror 103 can have a reflectivity between about 0.01% and about 99.9% for incident light having a reflective wavelength in the operating wavelength range of the tunable laser. The comb mirror 103 has a plurality of reflection peaks in the operating wavelength range of the tunable laser. Each reflection peak can have a maximum reflection at a wavelength in the operating wavelength range of the tunable laser and a bandwidth given by the spectral width of the individual reflection peak at half the maximum reflection. The wavelength at which the maximum of an individual reflection peak occurs can be tuned electrically or thermally. For example, the wavelength at which the maximum of an individual reflection peak occurs can be changed by changing the temperature of the comb mirror 103 or by providing an electrical current or electrical voltage to the comb mirror 103. The bandwidth of an individual reflection peak can be in a range between about 0.001 nm and about 10 nm, between about 0.01 nm and about 5 nm, between about 0.05 nm and about 4 nm, between about 0.1 nm and about 3 nm, between about 0.2 nm and about 2.5 nm, between about 0.5 nm and about 2.0 nm, between about 0.7 nm and about 1.0 nm, or any value in a range/sub-range formed by these values.

The distance between consecution reflection peaks of the comb mirror 103 is referred to as free spectral range (FSR). The FSR can be between about 0.05 nm and about 50 nm, between about 0.1 nm and about 30 nm, between about 0.1 nm and about 1 nm, between about 0.2 nm and about 10 nm, between about 0.3 nm and about 15 nm, between about 0.5 nm and about 15 nm, a value in any range/sub-range formed by any of these values. The laser cavity formed by the comb mirror 103 and the broadband mirror 104 has a plurality of cavity modes. In various embodiments, the laser cavity can be configured such that a non-integer number of cavity modes may fit into a single free spectral range (distance between two consecutive reflection peaks) of the comb mirror 103. Without any loss of generality, when the laser cavity is configured such that a non-integer number of cavity modes are present between two consecutive reflection peaks of the comb mirror 103, different cavity modes would overlap with different portions of consecutive reflection peaks of the comb mirror 103. Accordingly, in many embodiments of the innovative tunable laser comprising a comb mirror, different cavity modes selected by consecutive reflection peaks of the comb mirror would not be able to simultaneously lase. Without any loss of generality, the optical path length of the laser cavity can be configured such that a non-integer number of cavity modes may fit into a single free spectral range (distance between two consecutive reflection peaks) of the comb mirror 103. In various embodiments, the comb mirror 103 can be a sampled grating distributed Bragg reflector (SGDBR).

The broadband mirror 104 can be configured as a front or a back mirror of the laser device. Similarly, the comb mirror 103 can be configured as a front or a back mirror. In various embodiments, the front mirror has a reflectivity configured to allow a portion of the laser signal to be output through the front mirror. For example, the front mirror can have a reflectivity between about 0.1% and about 99%, between about 0.1% and about 60%, between about 1% and about 80%, between about 5% and about 70%, between about 10% and about 65%, between about 20% and about 60%, or any value in a range/sub-range defined by any of these values so as to allow output a portion of the laser signal through the front mirror. Other values outside this range are also possible. Various embodiments may make use of the laser signal from either end of the laser, or in some applications from both ends simultaneously.

As discussed above, the wavelengths at which the reflectivity of the plurality of reflection peaks of comb mirror 103 have a maximum value can be tuned such as, for example by providing an electric current and/or electrical voltage through an electrical contact associated with the comb mirror 103. In this manner, the comb mirror 103 is configured to select one or more of the cavity modes to generate a laser signal at a desired wavelength. Without any loss of generality, tuning the comb mirror 103 can result in movement of at least one of the reflection peaks across the cavity modes such that at least one of the cavity modes overlaps with the at least one of the reflection peaks. In some embodiments, heater pads or liquid crystal with electrodes configured to apply voltage across the liquid crystal can be associated with the comb mirror 103 and used to tune the FSR of the comb mirror 103. Various embodiments of heater pads include disposing a resistive metallic strip over the comb mirror 103, and applying an electric current through the resistive strip resulting in local heating which ultimately results in tuning of the comb mirror. Various parameters (e.g., length of the cavity, reflectivity of the comb mirror 103 and/or the broadband mirror 104) can be adjusted such that the cavity modes are spaced wide enough apart to obtain a laser signal with a single mode having side mode suppression ratio (SMSR) greater than about 20 dB (e.g., about 30 dB, about 40 dB, about 50 dB, etc. or any range formed by any of these values). In various embodiments, the output signal from the laser can have a SMSR between about 10 dB and about 150 dB, between about 30 dB and about 140 dB, between about 40 dB and about 120 dB, between about 50 dB and about 110 dB, between about 60 dB and about 100 dB, between about 70 dB and about 90 dB or any range or a combination of ranges between any of these value.

The laser cavity formed by the broadband mirror 104 and the comb mirror 103 can include an optional phase section 101 to help manipulate the cavity mode placement. The phase section 101 can be configured to effect a change in the optical path length of the optical signal in the cavity. In various embodiments, electrical current or an electrical voltage can be applied to the phase section 101 through electrical contacts (e.g., in proximity to the phase section) to alter the optical path length of the optical signal in the laser cavity. In some embodiments, the optical path length of the optical signal in the laser cavity can be changed by effecting a temperature change in the phase section 101. A temperature change in the phase section 101 can be caused, for example, by applying an electric current through a resistive strip disposed with respect to the phase section 101.

In various embodiments, the phase section 101 can be disposed between the gain region 102 and the comb mirror 103, and in some embodiments the phase section 101 can be within the gain region 102. Other locations are also possible. The phase section 101 is optional and in some embodiments, the phase section 101 can be omitted. In such embodiments, cavity mode tuning can be achieved either thermally (e.g., by applying an electrical current through a resistive heat strip) or through second order effects relating to carrier density or stress and strain in the gain region 102. In some embodiments, the comb mirror 103 may be pumped to induce gain either optically or electrically. In some embodiments, the gain region 102 can be divided into two or more portions by providing additional reflectors (e.g., reflector 105) in the gain region 102 as shown in FIG. 2. In the embodiment depicted in FIG. 2, the reflector 105 is placed in the phase section 101. However, in other embodiments, the reflector 105 can be disposed in the gain region 102. The reflectivity of the reflector 105 can be in a range between about 1% and about 50% in the wavelength range of operation of the laser 200. The reflector 105 may advantageously increase the effective free spectral range (FSR) of dominant cavity modes.

Yet another embodiment of the innovative tunable laser comprising a comb mirror incorporates Y-branch laser technology as shown in FIG. 3. The embodiment of the tunable laser 300 depicted in FIG. 3 can be configured as a dual output laser. The dual output laser comprises a first waveguide comprising a single comb mirror 103 coupled to a second waveguide comprising the phase section 101 and a third waveguide comprising the gain section 102. A broadband mirror 104 is disposed at the ends of the second and the third waveguides opposite the comb mirror 103 as shown in FIG. 3. The two broadband mirrors 104 may or may not be HR (highly reflective). In various embodiments, the two broadband mirrors 104 can comprise high reflective coatings. The embodiment of the Y-branch laser 300 illustrated in FIG. 3 can be modified in various ways. For example, in some embodiments, the second waveguide need not comprise a phase section. As another example, in some embodiments, the second waveguide can comprise an additional gain region. As another example, the first and the second waveguides can comprise additional gain regions. As yet another example, the first and/or the third waveguides can comprise additional phase sections. In some embodiments, the Y-branch laser can comprise a broadband mirror 104 disposed at an end of the first waveguide and two comb mirrors 103 disposed at the ends of the second and third waveguides. In some such embodiments, the two comb mirrors 103 can be identical. For example, both the comb mirrors 103 can have the same reflectivity and/or the same FSR. In some other embodiments, the two comb mirrors need not be identical. For example, the two comb mirrors 103 can have different reflectivities and/or different FSRs. In some embodiments, all of the first, second and third waveguides may include a gain region similar to the gain region (102). Many other variations are possible.

The innovative tunable laser comprising a comb mirror described herein can be designed to operate in wavelength ranges between about 600 nm and about 1900 nm, less than 600 nm, greater than 1900 nm where spontaneous emission and stimulated emission are available. Embodiments of the innovative tunable laser comprising a comb mirror discussed herein can be fabricated from a variety of materials including but not limited to III-V semiconductor materials such as InP, GaAs, InGaAP, InAlAsP, GaN; erbium doped glasses; Silicon Germanium, and other laser materials. Embodiments of the innovative tunable laser comprising a comb mirror discussed herein can also comprise hybrid combinations of materials, for example, by butt-coupling or wafer bonding gain material to other active or passive material. Various implementations of the innovative tunable laser comprising a comb mirror described herein can be fabricated by monolithically integrating the gain region, the optional phase section, and the comb mirror on a substrate comprising a waveguide layer. The substrate can be a crystalline substrate. In some embodiments, the substrate can comprise a semiconductor material.

The radiation emitted from the gain region 102 when the tunable laser is not configured to lase can have a peak with a maximum gain value and a bandwidth which is equal to the spectral width at which the gain is half the maximum gain value. Without any loss generality, the bandwidth of the gain peak can be greater than the FSR of the comb mirror as shown in FIG. 5E. Without any loss of generality, the bandwidth of the gain peak can be wide enough to accommodate two or more reflection peaks of the comb mirror 103. For example, the bandwidth of the gain peak can be wide enough to accommodate at least 3, at least 4, at least 5, at least 10 reflection peaks, at least 20 reflection peaks, at least 30 reflection peaks or any ranges between any of these values of the comb mirror 103. In some implementations, the bandwidth of the gain peak can be wide enough to accommodate at least 1 reflection peak of the comb mirror 103.

In various embodiments, the gain region 102 can extend into the comb mirror 103. In some embodiments, the comb mirror 103 can be formed in the gain region 102. In some implementations of the tunable laser the comb mirror 103 can comprise an additional gain material different from the gain medium in the gain region 102. The additional gain material can be distributed through the entire length of the comb mirror 103 or distributed in one or more sections. The one or more sections of the comb mirror 103 can be separate from the gain region 102 as shown in FIG. 4A. The one or more sections of the comb mirror 103 comprising the additional gain material can be periodic as shown in FIG. 4A or non-periodic. The additional gain material can be the same as the material of the gain region 102 or different from the material of the gain region 102. As another example, the gain region 102 can comprise the comb mirror 103. Including gain in the mirror region can advantageously reduce the FWHM of the reflection peaks of the comb mirror 103 which can advantageously allow higher selectivity between cavity modes. Reducing the FWHM of the reflection peaks of the comb mirror 103 can also result in the tunable laser having a larger tuning range with more comb peaks. The existence of more comb peaks can allow for individual cavity modes to be independently selected. In some such implementations of the tunable laser, thermal tuning can be used to tune the comb mirror 103. In some implementations one or more sections of the comb mirror 103 can include gain medium and one or more other sections of the comb mirror 103 can be devoid of gain medium. For example, a tunable laser comprising a comb mirror can comprise one or more sections having gain medium and one or more section without gain medium. In such implementations the comb mirror can be provided with two or more electrical contacts, one or more electrical contacts for injecting current into the gain medium and one or more other contacts for injecting current into the portions of the comb mirror not including gain medium to accomplish wavelength tuning.

FIG. 4A illustrates an implementation of a laser comprising a comb mirror 103 with one or more sections comprising gain medium and one or more sections without gain medium. In the implementation illustrated in FIG. 4A, the comb mirror 103 comprises a plurality of mirror bursts (or a plurality of spaced apart reflective regions) with gain sections provided between the mirror bursts. Alternately, the gain medium can be distributed through the entire length of the comb mirror 103. In the implementation illustrated in FIG. 4A, gain medium is periodically introduced throughout the comb mirror 103. The laser can be provided with one or more electrical contact regions to provide electrical current or voltage to different portions of the laser. FIG. 4B is an example of a mask layer that can be used to fabricate portions of the laser illustrated in FIG. 4A. The mask layer shown in FIG. 4B comprises a phase contact section 101c at left configured to provide electrical current or voltage to the phase section 101, a gain contact section 102c configured to provide electrical current or voltage to the gain region, and a comb mirror gain contact region 103ac configured to provide electrical current or voltage to the optically active sections of the comb mirror 103 that comprise a gain medium and a comb mirror tuning contact region 103pc to provide electrical current or voltage to the optically passive regions of the comb mirror 103. The lengths of the gain, mirror and phase sections illustrated in FIG. 4B may vary and be significantly different from the example shown here. Likewise, the number of mirror bursts in the comb mirror shown in FIG. 4B may vary significantly. As discussed above, one or more heaters can be used for wavelength tuning the laser of FIG. 4A instead of or in addition to injection current.

Operation of the Innovative Tunable Laser Comprising a Comb Mirror

Wavelength tuning in various embodiments of the innovative tunable laser comprising a comb mirror at one end and a broadband reflector at the other end as described herein can be accomplished by moving the reflection peaks of the comb mirror to select different cavity modes of the laser. For example, at least one of the reflection peaks of the comb mirror can be moved to select one of the cavity modes. To achieve continuous tuning, at least one of the reflection peaks of the comb mirror is capable of being moved by an amount greater than or equal to the distance between consecutive reflection peaks (also referred to as free spectral range (FSR)) of the comb mirror. In contrast, wavelength tuning in implementations of a sampled grating distributed Bragg reflector (SGDBR) laser comprising two sampled grating distributed Bragg reflectors (SGDBRs) at both ends of a laser cavity is accomplished by Vernier tuning of the two sampled grating distributed Bragg reflectors. In embodiments of a coupled cavity laser, wavelength tuning can be accomplished by Vernier tuning of cavity modes. Embodiments of the innovative tunable laser comprising a comb mirror at one end and a broadband reflector at the other end as described herein can be tuned using two tuning controls—for example, one tuning control for a phase section and a second tuning control for a mirror section instead of three tuning controls—for example, one tuning control for a phase section and two tuning controls for mirror sections that are used to achieve wavelength tuning in implementations of a SGDBR laser comprising two sampled grating distributed Bragg reflectors (SGDBRs) at both ends of a laser cavity.

Reducing the number of tuning controls can be advantageous in reducing the complexity of operating the device and can also simplify packaging. Moreover, with one less section to control, there is an opportunity to reduce the footprint size and/or the power consumption of the semiconductor laser device.

The tuning operation of an embodiment of the innovative tunable laser comprising a comb mirror contemplated here is shown in FIGS. 5A-5E. FIG. 5A illustrates the cavity modes of the laser cavity of the innovative tunable laser comprising a comb mirror. FIG. 5B illustrates the reflection peaks of the comb mirror. As discussed above, the laser cavity can be configured such that the spacing between the cavity modes relative to the spacing between the reflection peaks of the comb mirror can be controlled to ensure that the nearest neighbors to a selected cavity mode are significantly suppressed. FIGS. 5A and 5B illustrate an example of a tunable laser with laser cavity and the comb mirror configured to allow approximately 6.8 cavity modes between individual reflection peaks (or FSR) of the comb mirror. As a result, if a cavity mode lines up with a first reflection peak of the comb mirror, another cavity mode would line up with a sixth reflection peak as shown in FIG. 5C. Lasing occurs where cavity mode lines up with mirror comb corresponding to the left and right most modes in FIG. 5C. The bandwidth of the gain peak of the gain region of the laser can be broad relative to the FSR of the comb mirror and can accommodate 2 or more reflectance peaks of the comb mirror within the gain bandwidth of the gain region (e.g., gain region 102) as shown in FIG. 5D. Accordingly, the bandwidth of the gain peak does not drive the selection between adjacent competing reflection peaks of the comb mirror. The competition between two or more dominant modes that are spaced apart by the five times the FSR is achieved by the roll off of the gain curve and/or the response of the individual reflection peak. Accordingly, only one cavity mode that overlaps with the reflection peak of the comb mirror and occurs near the maximum of the gain peak lases as shown in FIG. 5E.

The tuning of the mirror and phase section can in some embodiments be achieved electrically or thermally, and the gain in the laser gain section can in some embodiments be achieved electrically or through optical pumping.

The tuning operation of the innovative tunable laser comprising a comb mirror discussed herein is significantly different from other existing lasers (e.g., the SGDBR laser). As discussed above, wavelength tuning in various embodiments of the tunable laser comprising a comb mirror discussed herein is accomplished by a Vernier effect between the FSR of the reflection peaks and the cavity modes. The cavity modes in various embodiments of the innovative tunable laser comprising a comb can be tuned over a small wavelength range by the phase section. In contrast, the comb mirrors can be tuned over a large wavelength. Accordingly, the mirror comb can be tuned over most of the available index tuning range, minus half a cavity mode spacing. Continuous tuning in the innovative tunable laser comprising a comb mirror can be achieved using a mirror comb with FSR that is substantially close to the index tuning range. In contrast, the comb spacing may be denser in a SGDBR tunable laser to allow for full tuning of one mirror comb spacing plus half the width of the comb of the other mirror. The wavelength maps from innovative tunable laser comprising a comb mirror show a constant hopping between the modes of the comb mirror, before repeating back to the first mirror comb on the next available cavity mode as depicted in FIG. 7. This operation is different from the mode selection and tuning process of a SGDBR laser. Furthermore, the design of the innovative tunable laser comprising a comb mirror is different from a conventional SGDBR laser, with different rules pertaining to the design of the mirror, and a different set of constraints on the design of the cavity length vs the design of the mirror.

For comparison, FIGS. 6A-6D describes the mode selection process for tuning in an SGDBR laser comprising two SGDBRs. The spacing between individual reflection peaks of the first SGDBR (e.g., front SGDBR) can be different from the spacing between individual reflection peaks of the second SGDBR (e.g., rear SGDBR) as shown in FIGS. 6A and 6B. The two SGDBRs with slightly different spacing between individual reflection peaks are tuned to achieve wavelength tuning. When a comb peak from each mirror is aligned with a comb peak from the other, lasing can occur as shown in FIGS. 6C and 6D. FIG. 6D shows two lasing modes that would be down selected by gain spectrum or mirror strength envelope. The selection process is dominated by the interplay of two comb mirrors and their relative alignment to one another.

Example Wavelength Map of the Innovative Tunable Laser Comprising a Comb Mirror

A section of a tuning map generated by simulating the operation of the innovative tunable laser comprising a comb mirror discussed herein is shown in FIG. 7 below. Although, the tuning map in FIG. 7 is in the wavelength range between about 1620 nm and about 1680 nm, the innovative tunable laser comprising a comb mirror can be designed to operate in other wavelength ranges between about 600 nm and about 1900 nm, less than 600 nm, greater than 1900 nm or in other wavelength ranges where spontaneous emission and stimulated emission are available.

The simulation shown in FIG. 7 is obtained by using a simple model based on the tuning mechanism discussed above with reference to FIGS. 5A-5E considering the interaction between the reflection peaks of the comb mirror, the cavity modes and the gain bandwidth. The simulation does not include other physical phenomena such as four wave mixing, threshold variation affecting carrier density and cavity index, the alpha parameter etc. which can affect the wavelength tuning map. Some designs may exhibit "stickiness" of modes due to four wave mixing or other nonlinear or linear effects, or hysteresis in tuning due to alpha parameter, four wave mixing or other nonlinear or linear effects. In some cases the hysteresis and mode sticking effects may be useful to the stability and predicable tuning of these devices. Accordingly, the wavelength maps of such designs may be different from the wavelength map shown in FIG. 7. However, in those embodiments of the innovative tunable laser comprising a comb mirror in which the effects of other physical phenomena such as four wave mixing, threshold variation affecting carrier density and cavity index, the alpha parameter etc. are reduced, the wavelength map may be similar to the wavelength map shown in FIG. 7. The existence of hysteresis may in some cases mean that direction of tuning on the map is related to wavelength accessibility. The simulated wavelength map shown in FIG. 7 is obtained by using only two controls—tuning the phase section to tune the cavity modes and tuning the comb mirror to tune the reflection peaks. Accordingly, the wavelength map iterates repeatedly across multiple comb modes, using different cavity modes for each iteration. The innovative tunable laser comprising a comb mirror can be continuously tuned to select any wavelength in a desired operating range using one or two controls—e.g., phase section to tune the cavity modes and tuning the comb mirror to tune the reflection peaks. As used herein continuous tuning refers to the ability to configure the laser to operate at any wavelength in a wavelength range by appropriate selection of laser parameters, such as, for example, current or voltage to the gain regions, current or voltage to the phase section and current or voltage to the comb mirror.

Example Early Prototype Data

Some wavelength maps from early prototypes of the innovative tunable laser comprising a comb mirror are shown in FIGS. 8A-1, 8A-2, 9A, 9B-1 and 9B-2. These wavelength maps show multiple continuous wavelength spans selected by combination of a mirror comb peak and cavity mode on the wavelength map. The interleaving of super-modes can also occur in part as a result of second order processes including thermal and nonlinear effects. Tuning continuity in these designs is in some cases compromised by mode sticking or other second order effects. These examples are included to show the presence in some embodiments of second order effects and other non-linear processes that can lead to maps useful but different from the simulated wavelength map shown in FIG. 7.

FIG. 8A-1 is a wavelength tuning map obtained by varying the electrical current to the comb mirror and the phase section. The FSR of the comb mirror and the cavity modes were configured to provide approximately 20 nm of wavelength tuning as shown in the wavelength histogram shown in FIG. 8A-2. FIG. 9A shows the spectrum of light output from an embodiment of a tunable laser comprising a comb mirror for different operating conditions. As seen from the wavelength spectra 901, 903, 905, 907, 909, 911 and 913, a side mode suppression ratio (SMSR) greater than about 30 dB is achieved for various operating conditions of the embodiment of the innovative tunable laser comprising a comb mirror. The different operating conditions of the innovative tunable laser comprising a comb mirror are characterized by different values of phase and comb mirror currents. FIG. 9B-1 illustrates the wavelength map between 1620 nm and 1650 nm for the embodiment of the innovative tunable laser comprising a comb mirror and FIG. 9B-2 is a wavelength histogram corresponding to the wavelength map of FIG. 9B-1. As noted above, the different color streaks in the wavelength map shown in FIG. 9B-1 correspond to non-adjacent cavity modes that are tuned continuously when selected by the mirror.

As the current applied to the comb mirror of the innovative tunable laser comprising a comb mirror is increased, the wavelengths of light output from the innovative tunable laser comprising a comb mirror cycle through wavelengths that are defined primarily by spacing of the mirror comb. One cycle may not result in a continuous tuning range, however, the tunable laser can be configured such that this series of comb modes can be repeated for multiple adjacent cavity modes as the mirror is further tuned and cycled through the mirror peaks. A continuous tuning range can be achieved this way if desired, as shown in FIGS. 9B-1 and 9B-2.

In contrast, the wavelength map obtained for an embodiment of a SGDBR laser illustrated in FIG. 10 is different from the wavelength map shown in FIG. 9B-1. A SGDBR laser transitions through each mirror reflection peak in sequence and the combined tuning of two mirrors, allows quasi-continuous tuning across wavelength ranges that include multiple cavity mode hops along the way. To achieve continuous wavelength tuning in a SGDBR laser, would require tuning the phase section of the SGDBR in addition to the combined tuning of the two mirrors. In contrast, tuning the comb mirror and the phase section can achieve continuous wavelength tuning in the innovative tunable laser comprising a comb mirror. The difference between the tuning mechanisms is clear in that the color of the wavelength maps of FIG. 9B-1 and FIG. 10. The wavelength map for an embodiment of the tunable laser comprising a comb mirror illustrated in FIG. 9B-1 repeatedly cycles from left to right, gradually changing shade, whereas the wavelength map for an embodiment of a SGDBR laser illustrated in FIG. 10, the full tuning range is accessible within a single cycle of tuning the two mirrors with respect to each other over the entire tuning range. The tuning map for the implementation of the SGDBR laser hops in wavelength from cavity mode to cavity mode leaving wavelength gaps. In contrast, the innovative tunable laser comprising a comb mirror has the advantage of being able to display fully continuous wavelength range, without the wavelength gaps found in the wavelength map of the implementation of the SGDBR laser.

While the foregoing detailed description discloses several embodiments of the present invention, it should be understood that this disclosure is illustrative only and is not limiting of the present invention. It should be appreciated that the specific configurations and operations disclosed can differ from those described above, and that the apparatus and methods described herein can be used in contexts. Additionally, components can be added, removed, and/or rearranged. Additionally, processing steps may be added, removed, or reordered. A wide variety of designs and approaches are possible.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A wavelength tunable laser comprising:
at least one waveguide;
at least one comb reflector comprising a plurality of reflective regions, the at least one comb reflector having a plurality of reflection peaks in a wavelength range;
at least one broadband reflector having substantially uniform reflectivity for wavelengths in the wavelength range; and
at least one laser cavity formed by the at least one comb reflector and the at least one broadband reflector, the at least one laser cavity having a plurality of cavity modes, an optical length of the at least one laser cavity configured such that a non-integer number of the plurality of cavity modes are between consecutive reflection peaks of the at least one comb reflector;
wherein the at least one waveguide comprises a first waveguide, a second waveguide, and a third waveguide in a Y-branch configuration;
wherein the at least one broadband reflector comprises a first broadband reflector disposed at an end of the first waveguide, and the at least one comb reflector comprises a first comb reflector disposed at an end of the second waveguide and a second comb reflector disposed at an end of the third waveguide,
wherein at least one of said first or second comb reflectors is configured to be thermally controlled and/or said wavelength tunable laser further comprises a phase section that is configured to be thermally controlled.

2. The wavelength tunable laser of claim 1, wherein the wavelength range is between 650 nm and 1950 nm.

3. The wavelength tunable laser of claim 2, wherein the wavelength range comprises at least one of a first range of 1250 nm to 1360 nm, a second range of 1500 nm to 1580 nm, or a third range of 1600 nm to 1700 nm.

4. The wavelength tunable laser of claim 1, further comprising one or more electrodes configured to provide electrical current or voltage to move the plurality of reflection peaks of the first comb reflector and/or the second comb reflector with respect to the plurality of cavity modes to select a desired lasing wavelength.

5. The wavelength tunable laser of claim 1, wherein the first comb reflector and the second comb reflector comprise a periodically chirped reflector, a superstructure grating, or a sampled grating distributed Bragg reflector.

6. The wavelength tunable laser of claim 1, wherein the laser comprises a hybrid combination of gain material integrated to a passive material.

7. The wavelength tunable laser of claim 1, wherein the first comb reflector and the second comb reflector have the same reflectivity and/or the same effective free spectral range as one another.

8. The wavelength tunable laser of claim 1, wherein the first comb reflector and/or the second comb reflector are configured to be electrically controlled such that at least one of the plurality of reflection peaks overlaps with one of the plurality of cavity modes.

9. The wavelength tunable laser of claim 1, wherein the first comb reflector and/or the second comb reflector are configured to be thermally controlled such that at least one of the plurality of reflection peaks overlaps with one of the plurality of cavity modes.

10. The wavelength tunable laser of claim 1, further comprising a second phase section, wherein the second phase section is configured to be controlled such that at least one of the plurality of reflection peaks overlaps with one of the plurality of cavity modes.

11. The wavelength tunable laser of claim 1, wherein the phase section is configured to be thermally controlled such that at least one of the plurality of reflection peaks overlaps with the one of the plurality of cavity modes.

12. The wavelength tunable laser of claim 1, wherein the first comb reflector and/or the second comb reflector are configured to be electrically controlled such that the wavelength of a maximum of at least one of the plurality of reflection peaks can be tuned.

13. The wavelength tunable laser of claim 1, wherein the first comb reflector and/or the second comb reflector are configured to be thermally controlled such that the wavelength of a maximum of at least one of the plurality of reflection peaks can be tuned.

14. The wavelength tunable laser of claim 1, further comprising a second phase section, wherein the phase section is configured to be controlled to tune the wavelength of a light output of the tunable laser.

15. The wavelength tunable laser of claim 1, wherein the phase section is configured to be thermally controlled to tune the wavelength of a light output of the tunable laser.

16. The wavelength tunable laser of claim 1, further comprising a gain region.

* * * * *